(12) United States Patent
Kim et al.

(10) Patent No.: US 8,882,556 B2
(45) Date of Patent: Nov. 11, 2014

(54) THIN FILM DEPOSITION APPARATUS, METHOD OF MANUFACTURING ORGANIC LIGHT-EMITTING DISPLAY DEVICE BY USING THE APPARATUS, AND ORGANIC LIGHT-EMITTING DISPLAY DEVICE MANUFACTURED BY USING THE METHOD

(75) Inventors: Jung-Yeon Kim, Yongin (KR); Un-Cheol Sung, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 247 days.

(21) Appl. No.: 12/984,289

(22) Filed: Jan. 4, 2011

(65) Prior Publication Data
US 2011/0186820 A1 Aug. 4, 2011

(30) Foreign Application Priority Data
Feb. 1, 2010 (KR) ........................ 10-2010-0009160

(51) Int. Cl.
| | | |
|---|---|---|
| H01J 9/00 | (2006.01) | |
| C23C 14/24 | (2006.01) | |
| C23C 14/56 | (2006.01) | |
| C23C 14/12 | (2006.01) | |
| C23C 14/04 | (2006.01) | |
| H01L 51/56 | (2006.01) | |

(52) U.S. Cl.
CPC .............. *C23C 14/243* (2013.01); *C23C 14/562* (2013.01); *H01L 51/56* (2013.01); *C23C 14/12* (2013.01); *C23C 14/044* (2013.01)
USPC .............................................. 445/23; 438/30

(58) Field of Classification Search
USPC .......... 313/504–506; 445/23–25; 438/30, 479
See application file for complete search history.

(56) References Cited

U.S. PATENT DOCUMENTS

| | | | |
|---|---|---|---|
| 4,416,217 A | 11/1983 | Nakamura et al. | |
| 4,468,648 A | 8/1984 | Uchikune | |

(Continued)

FOREIGN PATENT DOCUMENTS

| | | |
|---|---|---|
| CN | 1476279 A | 2/2004 |
| CN | 1489419 A | 4/2004 |

(Continued)

OTHER PUBLICATIONS

KIPO Registration Determination Certificate dated Jan. 13, 2012, for Korean patent application 10-2009-0056529, 5 pages.

(Continued)

*Primary Examiner* — Joseph L Williams
(74) *Attorney, Agent, or Firm* — Christie, Parker & Hale, LLP

(57) ABSTRACT

A thin film deposition apparatus, a method of manufacturing an organic light-emitting display device by using the thin film deposition apparatus, and an organic light-emitting display device manufactured using the method. In the thin film deposition apparatus for forming a thin film on a substrate, the apparatus includes a deposition source that discharges a deposition material; a deposition source nozzle unit disposed at a side of the deposition source and including a plurality of deposition source nozzles arranged in a first direction; a patterning slit sheet disposed opposite to the deposition source nozzle unit and including a common deposition region at an end of the patterning slit sheet and a plurality of patterning slits on the other end in a second direction perpendicular to the first direction, where each of the plurality of patterning slits includes a plurality of patterning sub slits that are different in length; and a barrier plate assembly disposed between the deposition source nozzle unit and the patterning slit sheet in the first direction, and including a plurality of barrier plates that partition a deposition space between the deposition source nozzle unit and the patterning slit sheet into a plurality of sub-deposition spaces. The thin film deposition apparatus is separated from the substrate by a predetermined distance. The thin film deposition apparatus and the substrate are movable relative to each other.

34 Claims, 10 Drawing Sheets

(56) References Cited

U.S. PATENT DOCUMENTS

| | | |
|---|---|---|
| 4,687,939 A | 8/1987 | Miyauchi et al. |
| 4,792,378 A | 12/1988 | Rose et al. |
| 4,901,667 A | 2/1990 | Suzuki et al. |
| 5,454,847 A | 10/1995 | Jacoboni et al. |
| 5,460,654 A | 10/1995 | Kikkawa et al. |
| 5,487,609 A | 1/1996 | Asada |
| 5,742,129 A | 4/1998 | Nagayama et al. |
| 5,909,995 A | 6/1999 | Wolf et al. |
| 6,045,671 A | 4/2000 | Wu et al. |
| 6,091,195 A * | 7/2000 | Forrest et al. .............. 313/504 |
| 6,099,649 A | 8/2000 | Schmitt et al. |
| 6,274,198 B1 | 8/2001 | Dautartas |
| 6,280,821 B1 | 8/2001 | Kadunce et al. |
| 6,371,451 B1 | 4/2002 | Choi |
| 6,417,034 B2 | 7/2002 | Kitazume et al. |
| 6,443,597 B1 | 9/2002 | Natori |
| 6,483,690 B1 | 11/2002 | Nakajima et al. |
| 6,541,130 B2 | 4/2003 | Fukuda |
| 6,554,969 B1 | 4/2003 | Chong |
| 6,579,422 B1 | 6/2003 | Kakinuma |
| 6,589,673 B1 | 7/2003 | Kido et al. |
| 6,650,023 B2 | 11/2003 | Kim |
| 6,699,324 B1 | 3/2004 | Berdin et al. |
| 6,749,906 B2 | 6/2004 | Van Slyke |
| 6,776,847 B2 | 8/2004 | Yamazaki et al. |
| 6,837,939 B1 | 1/2005 | Klug et al. |
| 6,878,209 B2 | 4/2005 | Himeshima et al. |
| 6,946,783 B2 | 9/2005 | Kim |
| 6,995,035 B2 | 2/2006 | Cok et al. |
| 7,006,202 B2 | 2/2006 | Byun et al. |
| RE39,024 E | 3/2006 | Takahashi |
| 7,078,070 B2 | 7/2006 | Peng |
| 7,199,520 B2 | 4/2007 | Fujii et al. |
| 7,282,855 B2 | 10/2007 | Park et al. |
| 7,322,248 B1 | 1/2008 | Long |
| 7,495,389 B2 | 2/2009 | Noguchi et al. |
| 7,601,439 B2 | 10/2009 | Chun et al. |
| 7,776,457 B2 | 8/2010 | Lee et al. |
| 7,872,256 B2 | 1/2011 | Sung et al. |
| 7,910,386 B2 | 3/2011 | Shiang et al. |
| 7,964,037 B2 | 6/2011 | Fukuda et al. |
| 8,022,448 B1 | 9/2011 | Luu et al. |
| 8,128,753 B2 | 3/2012 | Bulovic et al. |
| 8,137,466 B2 | 3/2012 | Kang et al. |
| 8,188,476 B2 | 5/2012 | Takagi et al. |
| 8,193,011 B2 | 6/2012 | Kang et al. |
| 8,673,077 B2 | 3/2014 | Sonoda et al. |
| 2001/0004186 A1 | 6/2001 | Song et al. |
| 2001/0006827 A1 | 7/2001 | Yamazaki et al. |
| 2001/0019807 A1 | 9/2001 | Yamada et al. |
| 2001/0026638 A1 | 10/2001 | Sangu et al. |
| 2001/0034175 A1 | 10/2001 | Miyazaki et al. |
| 2002/0011785 A1 | 1/2002 | Tang et al. |
| 2002/0017245 A1 | 2/2002 | Tsubaki et al. |
| 2002/0033136 A1 | 3/2002 | Savage et al. |
| 2002/0036759 A1 | 3/2002 | Ise et al. |
| 2002/0050061 A1 | 5/2002 | Komyoji et al. |
| 2002/0076847 A1 | 6/2002 | Yamada et al. |
| 2002/0168577 A1 | 11/2002 | Yoon |
| 2002/0179013 A1 | 12/2002 | Kido et al. |
| 2002/0187253 A1 | 12/2002 | Marcus et al. |
| 2002/0194727 A1 | 12/2002 | Cho et al. |
| 2002/0197393 A1 | 12/2002 | Kuwabara |
| 2003/0021886 A1 | 1/2003 | Baele |
| 2003/0101932 A1 | 6/2003 | Kang |
| 2003/0101937 A1 | 6/2003 | Van Slyke et al. |
| 2003/0117602 A1 | 6/2003 | Kobayashi et al. |
| 2003/0118950 A1 | 6/2003 | Chao et al. |
| 2003/0124764 A1 | 7/2003 | Yamazaki et al. |
| 2003/0151637 A1 | 8/2003 | Nakamura et al. |
| 2003/0164934 A1 | 9/2003 | Nishi et al. |
| 2003/0168013 A1 | 9/2003 | Freeman et al. |
| 2003/0173896 A1 | 9/2003 | Grushin et al. |
| 2003/0221614 A1 | 12/2003 | Kang et al. |
| 2003/0221620 A1 | 12/2003 | Yamazaki |
| 2003/0232563 A1 | 12/2003 | Kamiyama et al. |
| 2004/0016907 A1 | 1/2004 | Shi |
| 2004/0029028 A1 | 2/2004 | Shimizu |
| 2004/0056244 A1 | 3/2004 | Marcus et al. |
| 2004/0086639 A1 | 5/2004 | Grantham et al. |
| 2004/0096771 A1 | 5/2004 | Kashiwagi et al. |
| 2004/0115338 A1 | 6/2004 | Yoneda |
| 2004/0115342 A1 | 6/2004 | Shigemura |
| 2004/0123804 A1 | 7/2004 | Yamazaki et al. |
| 2004/0127066 A1 | 7/2004 | Jung |
| 2004/0134428 A1 | 7/2004 | Sasaki et al. |
| 2004/0142108 A1 | 7/2004 | Atobe et al. |
| 2004/0144321 A1 | 7/2004 | Grace et al. |
| 2004/0157167 A1 | 8/2004 | Morii |
| 2004/0183435 A1 | 9/2004 | Ohshita |
| 2004/0194702 A1 | 10/2004 | Sasaki et al. |
| 2004/0195530 A1 | 10/2004 | Kwak et al. |
| 2004/0216673 A1 | 11/2004 | Sakata et al. |
| 2004/0255857 A1 | 12/2004 | Chow et al. |
| 2004/0263547 A1 | 12/2004 | Sugahara |
| 2004/0263771 A1 | 12/2004 | Jeong et al. |
| 2005/0001546 A1 | 1/2005 | Yamaguchi |
| 2005/0016461 A1 | 1/2005 | Klug et al. |
| 2005/0031836 A1 | 2/2005 | Hirai |
| 2005/0037136 A1 | 2/2005 | Yamamoto |
| 2005/0039684 A1 | 2/2005 | Yi et al. |
| 2005/0072359 A1 | 4/2005 | Kim |
| 2005/0072361 A1 | 4/2005 | Yang et al. |
| 2005/0079418 A1 | 4/2005 | Kelley et al. |
| 2005/0110400 A1 | 5/2005 | Nakamura |
| 2005/0118788 A1 | 6/2005 | Kuwahara et al. |
| 2005/0129489 A1 | 6/2005 | Quan et al. |
| 2005/0153472 A1 | 7/2005 | Yotsuya |
| 2005/0166842 A1 | 8/2005 | Sakamoto |
| 2005/0166844 A1 | 8/2005 | Gralenski |
| 2005/0183670 A1 | 8/2005 | Grantham et al. |
| 2005/0186330 A1 | 8/2005 | Kim et al. |
| 2005/0213021 A1 | 9/2005 | Myoung |
| 2005/0217584 A1 | 10/2005 | Abiko et al. |
| 2005/0229848 A1 | 10/2005 | Shinriki et al. |
| 2005/0244580 A1 | 11/2005 | Cok et al. |
| 2005/0263074 A1 | 12/2005 | Masuda et al. |
| 2006/0011136 A1 | 1/2006 | Yamazaki et al. |
| 2006/0012771 A1 | 1/2006 | Jeong |
| 2006/0022590 A1 | 2/2006 | Aziz et al. |
| 2006/0040132 A1 | 2/2006 | Liao et al. |
| 2006/0045958 A1 | 3/2006 | Abiko et al. |
| 2006/0066231 A1 | 3/2006 | Nishikawa et al. |
| 2006/0090705 A1 | 5/2006 | Kim |
| 2006/0102078 A1 | 5/2006 | Fairbairn et al. |
| 2006/0110544 A1 | 5/2006 | Kim et al. |
| 2006/0113907 A1 | 6/2006 | Im et al. |
| 2006/0115585 A1 | 6/2006 | Bulovic et al. |
| 2006/0130766 A1 | 6/2006 | Kim et al. |
| 2006/0144325 A1 | 7/2006 | Jung et al. |
| 2006/0152641 A1 | 7/2006 | Brody |
| 2006/0164786 A1 | 7/2006 | Kobayashi et al. |
| 2006/0169211 A1 | 8/2006 | Kim et al. |
| 2006/0174829 A1 | 8/2006 | An et al. |
| 2006/0205101 A1 | 9/2006 | Lee et al. |
| 2006/0244696 A1 | 11/2006 | Jung et al. |
| 2006/0267294 A1 | 11/2006 | Busse et al. |
| 2006/0269671 A1 | 11/2006 | Kim et al. |
| 2006/0272572 A1 | 12/2006 | Uematsu et al. |
| 2006/0278522 A1 | 12/2006 | Kim et al. |
| 2006/0278945 A1 | 12/2006 | Sakurai |
| 2006/0280588 A1 | 12/2006 | Blonigan et al. |
| 2007/0009552 A1 | 1/2007 | Whitehead et al. |
| 2007/0009652 A1 | 1/2007 | Manz et al. |
| 2007/0017445 A1 | 1/2007 | Takehara et al. |
| 2007/0022955 A1 | 2/2007 | Bender et al. |
| 2007/0024185 A1 | 2/2007 | Kitamura et al. |
| 2007/0046185 A1 | 3/2007 | Kim |
| 2007/0046913 A1 | 3/2007 | Shibazaki |
| 2007/0054044 A1 | 3/2007 | Shimosaki et al. |
| 2007/0075955 A1 | 4/2007 | Jung et al. |
| 2007/0077358 A1 | 4/2007 | Jeong et al. |
| 2007/0148337 A1 | 6/2007 | Nichols et al. |
| 2007/0148348 A1 | 6/2007 | Huh et al. |

(56) References Cited

U.S. PATENT DOCUMENTS

| | | |
|---|---|---|
| 2007/0157879 A1 | 7/2007 | Yotsuya |
| 2007/0158471 A1 | 7/2007 | Park et al. |
| 2007/0163497 A1 | 7/2007 | Grace et al. |
| 2007/0178708 A1 | 8/2007 | Ukigaya |
| 2007/0190235 A1 | 8/2007 | Yamazaki et al. |
| 2007/0195844 A1 | 8/2007 | Ma et al. |
| 2007/0231460 A1 | 10/2007 | Ukigaya |
| 2007/0275497 A1 | 11/2007 | Kwack et al. |
| 2007/0297887 A1 | 12/2007 | Tanaka |
| 2008/0018236 A1 | 1/2008 | Arai et al. |
| 2008/0038935 A1 | 2/2008 | Baude et al. |
| 2008/0057183 A1 | 3/2008 | Spindler et al. |
| 2008/0100201 A1 | 5/2008 | Wei et al. |
| 2008/0100204 A1 | 5/2008 | Kim |
| 2008/0115729 A1 | 5/2008 | Oda et al. |
| 2008/0118743 A1 | 5/2008 | Lee et al. |
| 2008/0129194 A1 | 6/2008 | Abe et al. |
| 2008/0131587 A1 | 6/2008 | Boroson et al. |
| 2008/0145521 A1 | 6/2008 | Guo et al. |
| 2008/0174235 A1 | 7/2008 | Kim et al. |
| 2008/0216741 A1 | 9/2008 | Ling et al. |
| 2008/0238294 A1 | 10/2008 | Xu et al. |
| 2008/0251785 A1 | 10/2008 | Noh et al. |
| 2008/0286461 A1 | 11/2008 | Noguchi et al. |
| 2008/0290791 A1 | 11/2008 | Lee et al. |
| 2008/0298947 A1 | 12/2008 | Yeo et al. |
| 2008/0309718 A1 | 12/2008 | Oya et al. |
| 2009/0001882 A1 | 1/2009 | Park et al. |
| 2009/0014412 A1 | 1/2009 | Nozawa et al. |
| 2009/0017192 A1 | 1/2009 | Matsuura |
| 2009/0027767 A1 | 1/2009 | Souriau et al. |
| 2009/0124033 A1 | 5/2009 | Moriyama |
| 2009/0133629 A1 | 5/2009 | Kamikawa et al. |
| 2009/0153033 A1 | 6/2009 | Lee et al. |
| 2009/0165713 A1 | 7/2009 | Kim et al. |
| 2009/0169868 A1 | 7/2009 | Haglund, Jr. et al. |
| 2009/0170230 A1 | 7/2009 | Kidu et al. |
| 2009/0181163 A1 | 7/2009 | Uetake |
| 2009/0208754 A1 | 8/2009 | Chu et al. |
| 2009/0220691 A1 | 9/2009 | Kim |
| 2009/0229524 A1 | 9/2009 | Kim et al. |
| 2009/0232976 A1 | 9/2009 | Yoon et al. |
| 2009/0269881 A1 | 10/2009 | Furuta et al. |
| 2009/0277386 A1 | 11/2009 | Takagi et al. |
| 2009/0279173 A1 | 11/2009 | Chui et al. |
| 2009/0302750 A1 | 12/2009 | Jun et al. |
| 2009/0304906 A1 | 12/2009 | Suduo et al. |
| 2009/0304924 A1 | 12/2009 | Gadgil |
| 2009/0308317 A1 | 12/2009 | Sone et al. |
| 2009/0315456 A1 | 12/2009 | Furukawa et al. |
| 2010/0001301 A1 | 1/2010 | Karg et al. |
| 2010/0055810 A1 | 3/2010 | Sung et al. |
| 2010/0086672 A1 | 4/2010 | Von Drasek et al. |
| 2010/0089443 A1 | 4/2010 | Bloomstein et al. |
| 2010/0090594 A1 | 4/2010 | Choi et al. |
| 2010/0130020 A1 | 5/2010 | Kim et al. |
| 2010/0156279 A1 | 6/2010 | Tamura et al. |
| 2010/0165454 A1 | 7/2010 | Suetsugu et al. |
| 2010/0170439 A1 | 7/2010 | Negishi |
| 2010/0192856 A1 | 8/2010 | Sung et al. |
| 2010/0196607 A1 | 8/2010 | Carlson et al. |
| 2010/0248416 A1 | 9/2010 | Priddy et al. |
| 2010/0255198 A1 | 10/2010 | Cleary et al. |
| 2010/0271602 A1 | 10/2010 | Hanazaki |
| 2010/0275842 A1 | 11/2010 | Park et al. |
| 2010/0297348 A1 | 11/2010 | Lee et al. |
| 2010/0297349 A1 | 11/2010 | Lee et al. |
| 2010/0310768 A1 | 12/2010 | Lee et al. |
| 2010/0328197 A1 | 12/2010 | Lee et al. |
| 2010/0330265 A1 | 12/2010 | Lee et al. |
| 2010/0330712 A1 | 12/2010 | Lee et al. |
| 2011/0033619 A1 | 2/2011 | Lee et al. |
| 2011/0033621 A1 | 2/2011 | Lee et al. |
| 2011/0042659 A1 | 2/2011 | Kim et al. |
| 2011/0045617 A1 | 2/2011 | Kang et al. |
| 2011/0048320 A1 | 3/2011 | Choi et al. |
| 2011/0052791 A1 | 3/2011 | Jo et al. |
| 2011/0052795 A1 | 3/2011 | Choi et al. |
| 2011/0053296 A1 | 3/2011 | Lee et al. |
| 2011/0053300 A1 | 3/2011 | Ryu et al. |
| 2011/0068331 A1 | 3/2011 | Koh et al. |
| 2011/0123707 A1 | 5/2011 | Lee et al. |
| 2011/0139069 A1 | 6/2011 | Ahn et al. |
| 2011/0165327 A1 | 7/2011 | Park et al. |
| 2011/0168986 A1 | 7/2011 | Lee et al. |
| 2011/0220019 A1 | 9/2011 | Lee et al. |
| 2011/0220022 A1 | 9/2011 | Hong et al. |
| 2011/0241438 A1 | 10/2011 | Kim et al. |
| 2011/0262625 A1 | 10/2011 | Park et al. |
| 2011/0266944 A1 | 11/2011 | Song et al. |
| 2012/0006259 A1 | 1/2012 | Sung et al. |
| 2012/0009328 A1 | 1/2012 | Ryu et al. |
| 2012/0009332 A1 | 1/2012 | Kim et al. |
| 2012/0009706 A1 | 1/2012 | Choi et al. |
| 2012/0028390 A1 | 2/2012 | Lee et al. |
| 2012/0068199 A1 | 3/2012 | Sung et al. |
| 2012/0068201 A1 | 3/2012 | Sung et al. |
| 2012/0070928 A1 | 3/2012 | Kim et al. |
| 2012/0083061 A1 | 4/2012 | Kang et al. |
| 2012/0097992 A1 | 4/2012 | Jeong |
| 2012/0100282 A1 | 4/2012 | Lee et al. |
| 2012/0103253 A1 | 5/2012 | Park et al. |
| 2012/0132137 A1 | 5/2012 | Oh et al. |
| 2012/0145077 A1 | 6/2012 | Chang et al. |
| 2012/0148743 A1 | 6/2012 | Bulovic et al. |
| 2012/0174865 A1 | 7/2012 | Choi et al. |
| 2012/0175605 A1 | 7/2012 | Shin et al. |
| 2012/0183676 A1 | 7/2012 | Sonoda et al. |
| 2012/0214263 A1 | 8/2012 | Yamazaki et al. |
| 2012/0299016 A1 | 11/2012 | Choi |
| 2012/0299023 A1 | 11/2012 | Lee et al. |
| 2012/0299024 A1 | 11/2012 | Lee et al. |
| 2012/0301614 A1 | 11/2012 | Choi et al. |
| 2012/0301986 A1 | 11/2012 | Choi et al. |
| 2012/0313251 A1 | 12/2012 | Kato |
| 2013/0001528 A1 | 1/2013 | Chang et al. |
| 2013/0008379 A1 | 1/2013 | Chang et al. |
| 2013/0032829 A1 | 2/2013 | Sung et al. |
| 2013/0157016 A1 | 6/2013 | Kim |
| 2013/0217164 A1 | 8/2013 | Kang et al. |
| 2013/0291796 A1 | 11/2013 | Inoue et al. |
| 2013/0298829 A1 | 11/2013 | Jo et al. |
| 2013/0341598 A1 | 12/2013 | Chang et al. |
| 2014/0010957 A1 | 1/2014 | Inoue et al. |
| 2014/0014917 A1 | 1/2014 | Lee et al. |
| 2014/0014918 A1 | 1/2014 | Han |
| 2014/0014920 A1 | 1/2014 | Lee |
| 2014/0014921 A1 | 1/2014 | Choi |
| 2014/0014924 A1 | 1/2014 | Oh et al. |
| 2014/0014929 A1 | 1/2014 | Lee et al. |
| 2014/0034917 A1 | 2/2014 | Lee et al. |
| 2014/0045343 A1 | 2/2014 | Choi et al. |
| 2014/0077168 A1 | 3/2014 | Kim |
| 2014/0084262 A1 | 3/2014 | Kim |
| 2014/0084263 A1 | 3/2014 | Jin et al. |
| 2014/0110680 A1 | 4/2014 | Choe |
| 2014/0131667 A1 | 5/2014 | Chang |

FOREIGN PATENT DOCUMENTS

| | | |
|---|---|---|
| CN | 1500904 A | 6/2004 |
| CN | 1556872 A | 12/2004 |
| CN | 1607868 A | 4/2005 |
| CN | 1682569 A | 10/2005 |
| CN | 1704501 A | 12/2005 |
| CN | 1814854 A | 8/2006 |
| CN | 1841696 A | 10/2006 |
| EP | 1 413 644 | 4/2004 |
| EP | 1 418 250 | 5/2004 |
| EP | 1 518 940 | 3/2005 |
| EP | 2354270 A1 | 8/2011 |
| JP | 57-194252 | 11/1982 |
| JP | 2-247372 | 10/1990 |
| JP | 4-272170 | 9/1992 |

(56) References Cited

FOREIGN PATENT DOCUMENTS

| | | |
|---|---|---|
| JP | 5-22405 U1 | 3/1993 |
| JP | 5-98425 A2 | 4/1993 |
| JP | 05-230628 | 9/1993 |
| JP | 08-027568 | 1/1996 |
| JP | 09-095776 | 4/1997 |
| JP | 10-50478 | 2/1998 |
| JP | 10-120171 | 5/1998 |
| JP | 10-270535 | 10/1998 |
| JP | 11-144865 | 5/1999 |
| JP | 2000-68054 | 3/2000 |
| JP | 2000-282219 | 10/2000 |
| JP | 2000-323277 | 11/2000 |
| JP | 2001-28325 A2 | 1/2001 |
| JP | 2001-52862 | 2/2001 |
| JP | 2001-93667 | 4/2001 |
| JP | 2002-075638 | 3/2002 |
| JP | 2002-175878 | 6/2002 |
| JP | 2002-348659 A2 | 12/2002 |
| JP | 2003-3250 | 1/2003 |
| JP | 2003-77662 | 3/2003 |
| JP | 2003-157973 | 5/2003 |
| JP | 2003-297562 | 10/2003 |
| JP | 2003-197531 | 11/2003 |
| JP | 2003-321767 | 11/2003 |
| JP | 2003-347394 A2 | 12/2003 |
| JP | 2004-035964 | 2/2004 |
| JP | 2004-43898 | 2/2004 |
| JP | 2004-076150 | 3/2004 |
| JP | 2004-91858 A2 | 3/2004 |
| JP | 2004-103269 | 4/2004 |
| JP | 2004-103341 | 4/2004 |
| JP | 2004-107764 A2 | 4/2004 |
| JP | 2004-137583 | 5/2004 |
| JP | 2004-143521 A2 | 5/2004 |
| JP | 2004-169169 | 6/2004 |
| JP | 2004-199919 | 7/2004 |
| JP | 2004-225058 | 8/2004 |
| JP | 2004-342455 A2 | 12/2004 |
| JP | 2004-349101 | 12/2004 |
| JP | 2004-355975 | 12/2004 |
| JP | 2005-44592 | 2/2005 |
| JP | 2005-101505 | 4/2005 |
| JP | 2005-122980 | 5/2005 |
| JP | 2005-163099 | 6/2005 |
| JP | 2005-165015 | 6/2005 |
| JP | 2005-174843 | 6/2005 |
| JP | 2005-206939 | 8/2005 |
| JP | 2005-213616 A2 | 8/2005 |
| JP | 2005-235568 | 9/2005 |
| JP | 2005-293968 | 10/2005 |
| JP | 2005-296737 | 10/2005 |
| JP | 2006-028583 | 2/2006 |
| JP | 2006-172930 | 6/2006 |
| JP | 2006-176809 | 7/2006 |
| JP | 2006-210038 | 8/2006 |
| JP | 2006-219760 | 8/2006 |
| JP | 2006-275433 | 10/2006 |
| JP | 2006-292955 | 10/2006 |
| JP | 2006-307247 A2 | 11/2006 |
| JP | 2007-47293 | 2/2007 |
| JP | 2007-66862 | 3/2007 |
| JP | 2007-146219 | 6/2007 |
| JP | 2007-157886 | 6/2007 |
| JP | 2007-186740 | 7/2007 |
| JP | 2007-242436 | 9/2007 |
| JP | 2007-291506 | 11/2007 |
| JP | 2008-19477 A2 | 1/2008 |
| JP | 2008-108628 | 5/2008 |
| JP | 2008-121098 | 5/2008 |
| JP | 2008-521165 | 6/2008 |
| JP | 2008-156686 | 7/2008 |
| JP | 2008-196003 | 8/2008 |
| JP | 2008-248301 A2 | 10/2008 |
| JP | 2008-274373 | 11/2008 |
| JP | 2008-300056 | 12/2008 |
| JP | 2009-19243 | 1/2009 |
| JP | 2009-024208 | 2/2009 |
| JP | 2009-049223 | 3/2009 |
| JP | 2009-081165 | 4/2009 |
| JP | 2009-87910 | 4/2009 |
| JP | 2009-117231 A2 | 5/2009 |
| JP | 2010-159167 A2 | 7/2010 |
| JP | 2010-261081 | 11/2010 |
| JP | 2011-47035 | 3/2011 |
| JP | 2011-146377 | 7/2011 |
| JP | 2012-92448 | 5/2012 |
| JP | 2012-211352 | 11/2012 |
| KR | 1997-0008709 A | 2/1997 |
| KR | 10-0257219 | 2/2000 |
| KR | 10-2000-0019254 | 4/2000 |
| KR | 10-2000-0023929 | 5/2000 |
| KR | 10-2001-0024652 | 3/2001 |
| KR | 2001-0030175 A | 4/2001 |
| KR | 10-2001-0039298 A | 5/2001 |
| KR | 10-2001-0059939 | 7/2001 |
| KR | 10-2001-0092914 | 10/2001 |
| KR | 10-2001-0093666 | 10/2001 |
| KR | 20-0257218 Y1 | 12/2001 |
| KR | 10-2002-0000201 | 1/2002 |
| KR | 10-2002-0001555 | 1/2002 |
| KR | 2002-0025760 | 4/2002 |
| KR | 10-2002-0050922 | 6/2002 |
| KR | 10-2002-0090934 | 12/2002 |
| KR | 10-2002-0091457 A | 12/2002 |
| KR | 10-2003-0001745 | 1/2003 |
| KR | 10-2003-0034730 | 5/2003 |
| KR | 10-2003-0043012 A | 6/2003 |
| KR | 10-2003-0046090 | 6/2003 |
| KR | 2003-0069684 | 8/2003 |
| KR | 10-0405080 | 10/2003 |
| KR | 10-0406059 B1 | 11/2003 |
| KR | 10-2003-0091947 | 12/2003 |
| KR | 10-2003-0093959 | 12/2003 |
| KR | 10-2003-0094033 | 12/2003 |
| KR | 10-2004-0014258 | 2/2004 |
| KR | 20-0342433 Y1 | 2/2004 |
| KR | 10-2004-0034537 | 4/2004 |
| KR | 10-2004-0039910 A | 5/2004 |
| KR | 10-0430336 B1 | 5/2004 |
| KR | 10-2004-0050045 | 6/2004 |
| KR | 10-2004-0069281 | 8/2004 |
| KR | 10-2004-0084747 | 10/2004 |
| KR | 10-2004-0087142 | 10/2004 |
| KR | 10-2004-0110718 A | 12/2004 |
| KR | 10-0463212 | 12/2004 |
| KR | 10-2005-0018234 A | 2/2005 |
| KR | 10-2005-0028943 | 3/2005 |
| KR | 10-2005-0039140 A | 4/2005 |
| KR | 10-0483487 B1 | 4/2005 |
| KR | 10-2005-0062853 | 6/2005 |
| KR | 10-2005-0082644 A | 8/2005 |
| KR | 10-0520159 | 9/2005 |
| KR | 10-0532657 B1 | 12/2005 |
| KR | 10-2006-0008602 | 1/2006 |
| KR | 10-2006-0018745 | 3/2006 |
| KR | 2006-0020050 | 3/2006 |
| KR | 10-2006-0045225 A | 5/2006 |
| KR | 10-2006-0051746 A | 5/2006 |
| KR | 10-2006-0053926 A | 5/2006 |
| KR | 10-2006-0056706 | 5/2006 |
| KR | 10-2006-0058459 | 5/2006 |
| KR | 10-2009-0052828 A | 5/2006 |
| KR | 10-2006-0059323 A | 6/2006 |
| KR | 10-2006-0060994 | 6/2006 |
| KR | 10-2006-0065978 | 6/2006 |
| KR | 10-2006-0073367 | 6/2006 |
| KR | 2006-0049050 | 6/2006 |
| KR | 2006-0059068 | 6/2006 |
| KR | 10-2006-0077887 A | 7/2006 |
| KR | 10-2006-0080475 | 7/2006 |
| KR | 10-2006-0080481 | 7/2006 |
| KR | 10-2006-0080482 | 7/2006 |
| KR | 10-2006-0081943 A | 7/2006 |
| KR | 10-2006-0083510 | 7/2006 |

(56) References Cited

FOREIGN PATENT DOCUMENTS

| | | |
|---|---|---|
| KR | 10-2006-0092387 | 8/2006 |
| KR | 10-2006-0098755 | 9/2006 |
| KR | 10-2006-0104288 | 10/2006 |
| KR | 10-2006-0104675 | 10/2006 |
| KR | 10-2006-0104677 | 10/2006 |
| KR | 10-2006-0109561 A | 10/2006 |
| KR | 10-2006-0109627 | 10/2006 |
| KR | 10-0635903 B1 | 10/2006 |
| KR | 10-2006-0114462 | 11/2006 |
| KR | 10-2006-0114477 A | 11/2006 |
| KR | 10-2006-0114573 A | 11/2006 |
| KR | 10-0645719 B1 | 11/2006 |
| KR | 10-0646160 | 11/2006 |
| KR | 10-2006-0123944 | 12/2006 |
| KR | 10-0687007 | 2/2007 |
| KR | 10-2007-0025164 | 3/2007 |
| KR | 10-0696547 | 3/2007 |
| KR | 10-0696550 | 3/2007 |
| KR | 10-0697663 B1 | 3/2007 |
| KR | 10-0698033 | 3/2007 |
| KR | 10-0700466 | 3/2007 |
| KR | 10-2007-0035796 | 4/2007 |
| KR | 10-2007-0037848 A | 4/2007 |
| KR | 10-0711885 | 4/2007 |
| KR | 10-2007-0050793 | 5/2007 |
| KR | 10-0723627 | 5/2007 |
| KR | 10-2007-0056190 A | 6/2007 |
| KR | 10-0726132 | 6/2007 |
| KR | 10-0736218 B1 | 7/2007 |
| KR | 10-0739309 B1 | 7/2007 |
| KR | 10-0741142 B1 | 7/2007 |
| KR | 10-2007-0078713 | 8/2007 |
| KR | 10-2007-0080635 | 8/2007 |
| KR | 10-2007-0091437 A | 9/2007 |
| KR | 10-2006-0028115 | 10/2007 |
| KR | 10-2007-0098122 A | 10/2007 |
| KR | 10-2007-0101842 | 10/2007 |
| KR | 10-2007-0105595 | 10/2007 |
| KR | 10-0768212 | 10/2007 |
| KR | 10-0768212 B1 | 10/2007 |
| KR | 10-0770653 | 10/2007 |
| KR | 10-2007-0112668 | 11/2007 |
| KR | 10-2007-0114094 A | 11/2007 |
| KR | 10-0787457 B1 | 12/2007 |
| KR | 10-2008-0001184 | 1/2008 |
| KR | 10-2008-0003720 | 1/2008 |
| KR | 10-2008-0007896 A | 1/2008 |
| KR | 10-2008-0009285 A | 1/2008 |
| KR | 10-0797787 | 1/2008 |
| KR | 10-0800125 | 1/2008 |
| KR | 10-0815265 | 3/2008 |
| KR | 10-2008-0036983 | 4/2008 |
| KR | 10-0823508 | 4/2008 |
| KR | 10-0823511 B1 | 4/2008 |
| KR | 10-0827760 | 4/2008 |
| KR | 10-2008-0044239 A | 5/2008 |
| KR | 10-2008-0044775 | 5/2008 |
| KR | 10-2008-0046761 A | 5/2008 |
| KR | 10-2008-0048653 | 6/2008 |
| KR | 10-2008-0055124 | 6/2008 |
| KR | 10-2008-0057159 A | 6/2008 |
| KR | 10-0839380 | 6/2008 |
| KR | 10-2008-0060400 | 7/2008 |
| KR | 10-2008-0061132 | 7/2008 |
| KR | 10-2008-0061666 | 7/2008 |
| KR | 10-2008-0061774 | 7/2008 |
| KR | 10-2008-0062212 | 7/2008 |
| KR | 10-0899279 B1 | 7/2008 |
| KR | 10-2008-0076574 A | 8/2008 |
| KR | 10-2008-0088737 A | 10/2008 |
| KR | 10-2008-0104479 A | 12/2008 |
| KR | 10-2008-0104695 A | 12/2008 |
| KR | 10-2008-0109559 | 12/2008 |
| KR | 10-2009-0017910 A | 2/2009 |
| KR | 10-0889872 B1 | 3/2009 |
| KR | 10-2009-0038733 | 4/2009 |
| KR | 10-2009-0040618 | 4/2009 |
| KR | 10-2009-0047953 A | 5/2009 |
| KR | 10-2009-0052155 | 5/2009 |
| KR | 10-2009-0053417 | 5/2009 |
| KR | 10-2009-0066996 | 6/2009 |
| KR | 10-2009-0075887 A | 7/2009 |
| KR | 10-2009-0079765 A | 7/2009 |
| KR | 10-2009-0081717 A | 7/2009 |
| KR | 10-0908232 B1 | 7/2009 |
| KR | 10-2009-0093161 | 9/2009 |
| KR | 10-2009-0094911 A | 9/2009 |
| KR | 10-2009-0097453 | 9/2009 |
| KR | 10-2009-0107702 | 10/2009 |
| KR | 10-0922763 A | 10/2009 |
| KR | 10-2010-0000128 | 1/2010 |
| KR | 10-2010-0000129 | 1/2010 |
| KR | 10-2010-0002381 A | 1/2010 |
| KR | 10-2010-0026655 | 3/2010 |
| KR | 10-2010-0038088 A | 4/2010 |
| KR | 10-2010-0044606 A | 4/2010 |
| KR | 10-2010-0047796 | 5/2010 |
| KR | 10-0961110 B1 | 6/2010 |
| KR | 10-2010-0090070 | 8/2010 |
| KR | 10-2010-0099806 | 9/2010 |
| KR | 10-2010-0119368 A | 11/2010 |
| KR | 10-2010-0126125 | 12/2010 |
| KR | 10-2010-0128589 A | 12/2010 |
| KR | 10-2010-0130786 A | 12/2010 |
| KR | 10-2010-0133678 A | 12/2010 |
| KR | 10-2010-0138139 A | 12/2010 |
| KR | 10-1017654 B1 | 2/2011 |
| KR | 10-2011-0021090 A | 3/2011 |
| KR | 10-2011-0022512 A | 3/2011 |
| KR | 10-2011-0032589 A | 3/2011 |
| KR | 10-2011-0082418 A | 7/2011 |
| KR | 10-2011-0101767 | 9/2011 |
| KR | 10-2011-0110525 A | 10/2011 |
| KR | 10-2011-0120213 A | 11/2011 |
| KR | 10-2011-0138787 A | 12/2011 |
| KR | 10-2012-0006322 A | 1/2012 |
| KR | 10-2012-0006324 | 1/2012 |
| KR | 10-2012-0012300 | 2/2012 |
| KR | 10-2012-0042155 A | 5/2012 |
| KR | 10-2012-0065789 A | 6/2012 |
| KR | 10-2012-0080855 A | 7/2012 |
| KR | 10-2012-0081811 A | 7/2012 |
| KR | 10-1193186 B1 | 10/2012 |
| KR | 10-2012-0131545 A | 12/2012 |
| KR | 10-2013-0007308 A | 1/2013 |
| WO | WO 99/25894 A1 | 5/1999 |
| WO | 03043067 A1 | 5/2003 |
| WO | WO2004016406 A1 | 2/2004 |
| WO | 10-2005-0024324 A | 3/2005 |
| WO | WO 2008/004792 A1 | 1/2008 |

OTHER PUBLICATIONS

KIPO Office action dated Feb. 1, 2012, for Korean patent application 10-2010-0031848, 4 pages.
KIPO Registration Determination Certificate dated Sep. 28, 2011, for Korean Patent application 10-2009-0052357, 5 pages.
KIPO Registration Determination Certificate dated Nov. 25, 2011, for Korean Patent application 10-2010-0014277, 5 pages.
KIPO Office action dated Feb. 1, 2012, for Korean patent application 10-2010-0011196, 4 pages.
U.S. Appl. No. 13/031,756, filed Feb. 22, 2011, Yong Sup Choi et al., Samsung Mobile Display Co., Ltd.
English-language abstract of Korean Publication No. KR 10-2002-0034272, published 2002.
English-language abstract of Korean Publication No. KR 10-2002-0056238, published 2003.
English-language abstract of Korean Publication No. KR 10-2002-0088662, published 2003.
English-language abstract of Korean Publication No. KR 10-2005-0045619, published 2006.
English-language abstract of Korean Publication No. KR 10-2006-0126267, published 2007.

(56) References Cited

OTHER PUBLICATIONS

English-language abstract of Korean Publication No. KR 10-2008-0038650, published 2008.
U.S. Appl. No. 12/784,774, filed May 21, 2010, Choong-Ho Lee et al., Samsung Mobile Display Co., Ltd.
U.S. Appl. No. 13/014,225, filed Jan. 26, 2011, Jong-Won Hong et al., Samsung Mobile Display Co., Ltd.
U.S. Appl. No. 12/797,858, filed Jun. 10, 2010, Choong-Ho Lee et al., Samsung Mobile Display Co., Ltd.
U.S. Appl. No. 12/836,760, filed Jul. 15, 2010, Jong-Heon Kim, et al., Samsung Mobile Display Co., Ltd.
U.S. Appl. No. 12/784,804, filed May 21, 2010, Choong-Ho Lee, et al., Samsung Mobile Display Co., Ltd.
U.S. Appl. No. 12/849,193, filed Aug. 3, 2010, Ji-Sook Oh et al., Samsung Mobile Display Co., Ltd.
U.S. Appl. No. 12/979,193, filed Dec. 28, 2010, Hyun Sook Park et al., Samsung Mobile Display Co., Ltd.
U.S. Appl. No. 12/820,355, filed Jun. 22, 2010, Yong-Sup Choi et al., Samsung Mobile Display Co., Ltd.
U.S. Appl. No. 12/950,361, filed Nov. 19, 2010, Choong-Ho Lee, et al., Samsung Mobile Display Co., Ltd.
U.S. Appl. No. 12/795,896, filed Jun. 8, 2010, Jung-Min Lee, et al., Samsung Mobile Display Co., Ltd.
U.S. Appl. No. 12/856,942, filed Aug. 16, 2010, Yun-Mi Lee et al., Samsung Mobile Display Co., Ltd.
U.S. Appl. No. 12/814,816, filed Jun. 14, 2010, Jung-Min Lee et al., Samsung Mobile Display Co., Ltd.
U.S. Appl. No. 12/868,099, filed Aug. 25, 2010, Hee-Cheol Kang, et al., Samsung Mobile Display Co., Ltd.
U.S. Appl. No. 12/862,153, filed Aug. 24, 2010, Hee-Cheol Kang, et al., Samsung Mobile Display Co., Ltd.
U.S. Appl. No. 12/869,830, filed Aug. 27, 2010, Chang-Mog Jo, et al., Samsung Mobile Display Co., Ltd.
U.S. Appl. No. 12/849,092, filed Aug. 3, 2010, Choong-Ho Lee et al., Samsung Mobile Display Co., Ltd.
U.S. Appl. No. 12/873,556, filed Sep. 1, 2010, Young-Mook Choi, et al., Samsung Mobile Display Co., Ltd.
U.S. Appl. No. 12/873,689, filed Sep. 1, 2010, Young-Mook Choi, et al., Samsung Mobile Display Co., Ltd.
U.S. Appl. No. 12/815,673, filed Jun. 15, 2010, Jung-Min Lee, Samsung Mobile Display Co., Ltd.
U.S. Appl. No. 12/794,093, filed Jun. 4, 2010, Jung-Min Lee et al., Samsung Mobile Display Co., Ltd.
U.S. Appl. No. 12/862,125, filed Aug. 24, 2010, Jae-Kwang Ryu et al., Samsung Mobile Display Co., Ltd.
U.S. Appl. No. 12/795,001, filed Jun. 7, 2010, Choong-Ho Lee et al., Samsung Mobile Display Co., Ltd.
U.S. Appl. No. 12/813,786, filed Jun. 11, 2010, Choong-Ho Lee et al., Samsung Mobile Display Co., Ltd.
U.S. Appl. No. 12/820,270, filed Jun. 22, 2010, Jung-Min Lee et al., Samsung Mobile Display Co., Ltd.
U.S. Appl. No. 12/907,396, filed Oct. 19, 2010, Yong-Sup Choi, et al., Samsung Mobile Display Co., Ltd.
U.S. Appl. No. 12/987,569, filed Jan. 10, 2011, Yun-Mi Lee et al., Samsung Mobile Display Co., Ltd.
English machine translation of Japanese Publication 2004-349101 previously filed in an IDS dated Jan. 3, 2013, (10 pages), translated Nov. 27, 2012.
Patent Abstracts of Japan, and English machine translation of Japanese Publication 2009-024208 listed above, (30 pages), May 2, 2009.
KIPO Office action dated Aug. 1, 2011 for Korean Patent application 10-2009-0074001, (3 pages).
KIPO Office action dated Feb. 1, 2012 for Korean Patent application 10-2010-0014272, (4 pages).
KIPO Office action dated Feb. 6, 2012 for Korean Patent application 10-2010-0021835, (4 pages).
KIPO Office action dated Apr. 2, 2012 for Korean Patent application 10-2010-0066993, (4 pages).
KIPO Notice of Allowance dated Aug. 24, 2012 for Korean Patent application 10-2010-0066993, (5 pages).
KIPO Notice of Allowance dated Sep. 1, 2012 for Korean Patent application 10-2010-0014276, (5 pages).
KIPO Office action dated Aug. 28, 2012 for Korean Patent application 10-2010-0014274, (5 pages).
KIPO Notice of Allowance dated Oct. 31, 2011 for Korean Patent application 10-2010-0014273, (5 pages).
KIPO Office action dated Feb. 6, 2012 for Korean Patent application 10-2010-0014274, (9 pages).
U.S. Office action dated Sep. 12, 2012 for cross reference U.S. Appl. No. 12/815,673, (26 pages).
U.S. Office action dated Dec. 17, 2012 for cross reference U.S. Appl. No. 12/873,556, (37 pages).
KIPO Registration Determination Certificate dated Jul. 20, 2012, for Korean Patent application 10-2010-0003545, (5 pages).
KIPO Registration Determination Certificate dated Apr. 30, 2012, for Korean Patent application 10-2010-0066992, (5 pages).
Japanese Office action dated Aug. 21, 2012, for Japanese Patent application 2010-145075, (5 pages).
Japanese Office action dated Sep. 4, 2012, for Japanese Patent application 2010-152846, (4 pages).
KIPO Office action dated Sep. 1, 2012, for Korean Patent application 10-2010-0010136, (5 pages).
KIPO Notice of Allowance dated Sep. 1, 2012, for Korean Patent application 10-2010-0013848, (5 pages).
KIPO Notice of Allowance dated Sep. 1, 2012, for Korean priority Patent application 10-2010-0009160, (5 pages).
U.S. Notice of Allowance dated Mar. 18, 2013, for cross reference U.S. Appl. No. 12/795,001, (29 pages).
U.S. Office action dated Mar. 15, 2013, for cross reference U.S. Appl. No. 12/813,786, (33 pages).
U.S. Office action dated Mar. 19, 2013, for cross reference U.S. Appl. No. 13/194,759, (36 pages).
U.S. Office action dated Mar. 18, 2013, for cross reference U.S. Appl. No. 12/984,231, (29 pages).
U.S. Office action dated Mar. 22, 2013, for cross reference U.S. Appl. No. 12/987,569, (12 pages).
U.S. Office action dated May 7, 2013, for cross reference U.S. Appl. No. 12/820,270, (37 pages).
U.S. Office action dated Jun. 11, 2013, for cross reference U.S. Appl. No. 12/862,125, (37 pages).
U.S. Office action dated Jun. 26, 2013, for cross reference U.S. Appl. No. 12/794,093, (20 pages).
U.S. Office action dated Feb. 26, 2013 for cross reference U.S. Appl. No. 12/794,093, (31 pages).
U.S. Office action dated Jul. 17, 2013, for cross reference U.S. Appl. No. 12/984,231, (18 pages).
U.S. Office action dated Aug. 13, 2013 for cross reference U.S. Appl. No. 13/194,759, (28 pages).
U.S. Office action dated Dec. 26, 2012 for cross reference U.S. Appl. No. 12/815,673, (21 pages).
U.S. Office action dated Jan. 25, 2013 for cross reference U.S. Appl. No. 13/015,357, (21 pages).
U.S. Office action dated Apr. 1, 2013 for cross reference U.S. Appl. No. 12/784,774, (44 pages).
U.S. Office action dated May 24 2013 for cross reference U.S. Appl. No. 12/849,092, (31 pages).
U.S. Office action dated Jul. 3, 2013 for cross reference U.S. Appl. No. 12/873,689, (48 pages).
Korean Patent Abstracts for Korean Publication 10-2007-0097218 dated Oct. 4, 2007, corresponding to Korean Patent 10-0768212 dated Oct. 18, 2007 listed above.
U.S. Office action dated Oct. 11, 2013 for cross reference U.S. Appl. No. 12/907,396, (44 pages).
U.S. Office action dated Oct. 21, 2013 for cross reference U.S. Appl. No. 12/987,569, (14 pages).
European Search Report dated May 13, 2011 for European Application No. 11250019.4 (6 pages).
European Search Report dated May 20, 2011 for European Application No. 10251404.9 (12 pages).
European Search Report dated May 27, 2011 for European Application No. 10251514.5 (11 pages).
European Search Report dated Sep. 6, 2010 for European Application No. 10250962.7 (5 pages).

(56) References Cited

OTHER PUBLICATIONS

Japanese Patent Office Action dated Jan. 22, 2013 for Japanese Application No. 2010-116470, (3 pages).
Japanese Patent Office Action dated Jan. 8, 2013 for Japanese Application No. 2011-000180 (3 pages).
Japanese Patent Office Action dated Mar. 19, 2013 for Japanese Application No. 2011-097909, (3 pages).
JPO Office action dated Apr. 1, 2014, for Japanese Patent application 2010-286245 (4 pages).
JPO Office action dated Feb. 25, 2014, for corresponding Japanese Patent application 2013-128405 (3 pages).
JPO Office action dated Jan. 28, 2014, for corresponding Japanese Patent application 2011-097909 (4 pages).
KIPO Notice of Allowance dated Apr. 26, 2012 for Korean Application No. 10-2010-0066991 (5 pages).
KIPO Notice of Allowance dated Oct. 27, 2011 for Korean Application No. 10-2010-0002381 (5 pages).
KIPO Notice of Allowance dated Sep. 1, 2012, for Korean Patent application 10-2010-0013847 (5 pages).
KIPO Notice of Allowance dated Sep. 23, 2011 for Korean Application No. 10-2009-0055473 (5 pages).
KIPO Notice of Allowance dated Sep. 28, 2011 for Korean Application No. 10-2009-0045201 (5 pages).
KIPO Notice of Allowance dated Sep. 28, 2011 for Korean Application No. 10-2009-0052359 (5 pages).
KIPO Office action dated Apr. 4, 2012, issued in KR Application No. 10-2009-0112796 (5 pages).
KIPO Office Action dated Apr. 9, 2012 for Korean Application No. 10-2010-0031556 (4 pages).
KIPO Office action dated Feb. 1, 2012, for Korean Patent application 10-2010-0013847 (5 pages).
KIPO Office Action dated Feb. 6, 2012 for Korean Application No. 10-2010-0011480 (8 pages).
KIPO Office Action dated Feb. 6, 2012 for Korean Application No. 10-2010-0011481 (7 pages).
KIPO Office action dated Jan. 6, 2012, issued to KR Application No. 10-2010-0000897 (4 pages).
KIPO Office action dated Jul. 1, 2011, issued to KR Application No. 10-2009-0072111 (4 pages).
KIPO Office action dated Jun. 1, 2011, issued to KR Application No. 10-2009-0050528 (4 pages).
KIPO Office action dated Mar. 21, 2012, issued to KR Application No. 10-2010-0065465 (5 pages).
KIPO Registration Determination Certificate dated Jul. 2, 2012, for Korean Application No. 10-2010-0011480 (5 pages).
KIPO Registration Determination Certificate dated Jul. 2, 2012, for Korean Application No. 10-2010-0011481 (5 pages).
KIPO Registration Determination Certificate dated Nov. 30, 2011, for Korean application 10-2009-0056530 (5 pages).
KIPO Registration Determination Certificate, dated Jul. 20, 2012, issued to KR Application No. 10-2010-0000897 (5 pages).
Korean Registration Certificate dated Sep. 28, 2011 for Korean Application No. 10-2009-0045200 (5 pages).
SIPO Certificate of Patent dated Aug. 14, 2013, for Chinese application 20100266406.6, (36 pages).
SIPO Certificate of Patent dated Jul. 31, 2013, corresponding to Chinese Patent application 201110029291.3, (31 pages).
SIPO Office action dated Dec. 17, 2013, for Chinese Patent application 201010216896.9 (6 pages).
SIPO Office action dated Feb. 14, 2014, for corresponding Chinese Patent application 201101189614.0 (16 pages).
SIPO Office action dated Mar. 11, 2014, for corresponding Chinese Patent application 201010189581.X (9 pages).
SIPO Office Action dated May 29, 2013, for Chinese Application No. 201010189614.0 (12 pages).
SIPO Office Action dated Nov. 28, 2012 for Chinese Application No. 201110029291.3 (11 pages).
SIPO Office Action dated Oct. 9, 2012 for Chinese Application No. 201010266406.6 (6 pages).
Taiwanese Office action dated Apr. 14, 2014, for Taiwanese Patent application 100114360 (20 pages).
Taiwanese Office action dated Dec. 20, 2013, for Taiwanese Patent application 099116077 (8 pages).
U.S. Interview Summary dated Mar. 11, 2014 for U.S. Appl. No. 12/813,786 (4 pages).
U.S. Notice of Allowance dated May 9, 2014 for U.S. Appl. No. 13/194,759 (27 pages).
U.S. Office action dated Apr. 29, 2013, issued to U.S. Appl. No. 12/820,355 (31 pages).
U.S. Office Action dated Aug. 2, 2013 for U.S. Appl. No. 12/868,099 (32 pages).
U.S. Office action dated Aug. 21, 2013 issued in cross-reference U.S. Appl. No. 12/820,355 (14 pages).
U.S. Office action dated Aug. 7, 2013, issued to U.S. Appl. No. 13/015,357, (30 pages).
U.S. Office action dated Aug. 8, 2013, for cross reference U.S. Appl. No. 13/093,707, (7 pages).
U.S. Office Action dated Dec. 13, 2011 for U.S. Appl. No. 12/849,193 (30 pages).
U.S. Office action dated Dec. 16, 2013 for U.S. Appl. No. 14/054,536 (35 pages).
U.S. Office action dated Feb. 11, 2014, for cross reference U.S. Appl. No. 13/178,472 (8 pages).
U.S. Office action dated Feb. 6, 2014, for U.S. Appl. No. 12/984,231 (16 pages).
U.S. Office action dated Jul. 11, 2013 for U.S. Appl. No. 13/461,669 (27 pages.).
U.S. Office action dated Jul. 24, 2013, issued to U.S. Appl. No. 12/784,804, (52 pages).
U.S. Office action dated Jul. 5, 2013, issued to U.S. Appl. No. 12/873,556, (17 pages).
U.S. Office Action dated Jun. 11, 2013 for U.S. Appl. No. 12/979,656 (50 pages).
U.S. Office action dated Jun. 17, 2013, for cross reference U.S. Appl. No. 13/180,454, (23 pages).
U.S. Office Action dated Jun. 21, 2011 for U.S. Appl. No. 12/862,153 (21 pages).
U.S. Office action dated Mar. 17, 2014, for U.S. Appl. No. 12/950,361 (48 pages).
U.S. Office Action dated Mar. 23, 2012 for U.S. Appl. No. 12/849,193 (17 pages).
U.S. Office action dated May 22, 2013, for cross reference U.S. Appl. No. 13/219,427, (26 pages).
U.S. Office action dated May 24, 2013, for U.S. Appl. No. 13/279,077 (20 pages).
U.S. Office action dated Nov. 20, 2013, for cross reference U.S. Appl. No. 12/868,099, (14 pages).
U.S. Office action dated Nov. 22, 2013, issued to U.S. Appl. No. 13/198,591, (28 pages).
U.S. Office action dated Nov. 25, 2013, issued to U.S. Appl. No. 13/176,701, (49 pages).
U.S. Office action dated Nov. 4, 2013, for U.S. Appl. No. 13/219,427, (26 pages).
U.S. Office action dated Oct. 1, 2013, issued to U.S. Appl. No. 12/849,092, (13 pages).
U.S. Office Action dated Oct. 3, 2013 for U.S. Appl. No. 12/869,830 (28 pages).
U.S. Office action dated Oct. 7, 2013, issued to U.S. Appl. No. 13/279,077, (29 pages).
U.S. Office action dated Sep. 20, 2013, issued to U.S. Appl. No. 13/014,225, (33 pages).
U.S. Office action dated Sep. 25, 2013, for U.S. Appl. No. 13/031,756, (34 pages).
U.S. Patent Office Action dated May 16, 2013, issued to U.S. Appl. No. 13/235,337 (28 pages).
U.S. Notice of Allowance dated Feb. 20, 2014, issued to U.S. Appl. No. 12/907,396 (13 pages).
U.S. Notice of Allowance dated Feb. 28, 2014, issued to U.S. Appl. No. 13/279,077 (12 pages).
U.S. Notice of Allowance dated Jun. 11, 2014, issued to U.S. Appl. No. 13/468,835 (62 pages).

(56) References Cited

OTHER PUBLICATIONS

U.S. Notice of Allowance dated Jun. 30, 2014, issued to U.S. Appl. No. 12/907,396 (40 pages).
U.S. Office action dated Apr. 18, 2014, issued to U.S. Appl. No. 12/814,816 (9 pages).
U.S. Office action dated Dec. 13, 2013, issued to U.S. Appl. No. 13/180,454 (18 pages).
U.S. Office action dated Dec. 2, 2013, issued to U.S. Appl. No. 13/157,220 (33 pages).
U.S. Office action dated Jun. 17, 2014, issued to U.S. Appl. No. 13/157,220 (36 pages).
U.S. Office action dated May 6, 2014, issued to U.S. Appl. No. 13/467,998 (21 pages).
U.S. Office action dated Sep. 27, 2013, issued to U.S. Appl. No. 12/814,816 (19 pages).

\* cited by examiner

THIN FILM DEPOSITION APPARATUS, METHOD OF MANUFACTURING ORGANIC LIGHT-EMITTING DISPLAY DEVICE BY USING THE APPARATUS, AND ORGANIC LIGHT-EMITTING DISPLAY DEVICE MANUFACTURED BY USING THE METHOD

CROSS-REFERENCE TO RELATED APPLICATION

This application claims the benefit of Korean Patent Application No. 10-2010-0009160, filed on Feb. 1, 2010, in the Korean Intellectual Property Office, the disclosure of which is incorporated herein by reference.

BACKGROUND

1. Field

An aspect of the present invention relates to a thin film deposition apparatus, a method of manufacturing an organic light-emitting display device by using the thin film deposition apparatus, and an organic light-emitting display device manufactured by using the method. More particularly, an aspect of the present invention relates to a thin film deposition apparatus suitable for manufacturing large-sized display devices on a mass scale and that can improve manufacturing yield, a method of manufacturing an organic light-emitting display device using the thin film deposition apparatus, and an organic light-emitting display device manufactured by the method.

2. Description of the Related Art

Organic light-emitting display devices have a larger viewing angle, better contrast characteristics, and a faster response rate than other display devices, and thus have drawn attention as a next-generation display device.

Organic light-emitting display devices generally have a stacked structure including an anode, a cathode, and an emission layer interposed between the anode and the cathode. The devices display images in color when holes and electrons, injected respectively from the anode and the cathode, recombine in the emission layer and thus emit light. However, it is difficult to achieve high light-emission efficiency with such a structure, and thus intermediate layers, including an electron injection layer, an electron transport layer, a hole transport layer, a hole injection layer, or the like, are optionally additionally interposed between the emission layer and each of the electrodes.

Also, it is practically very difficult to form fine patterns in organic thin films such as the emission layer and the intermediate layers, and red, green, and blue light-emission efficiency varies according to the organic thin films. For these reasons, it is not easy to form an organic thin film pattern on a large substrate, such as a mother glass having a size of 5 G or more, by using a conventional thin film deposition apparatus, and thus it is difficult to manufacture large organic light-emitting display devices having satisfactory driving voltage, current density, brightness, color purity, light-emission efficiency, life-span characteristics, and so on. Thus, there is a demand for improvement in this regard.

An organic light-emitting display device includes intermediate layers, including an emission layer disposed between a first electrode and a second electrode that are arranged opposite to each other. The intermediate layers and the first and second electrodes may be formed using a variety of methods one of which is a deposition method. When an organic light-emitting display device is manufactured by using the deposition method, a fine metal mask (FMM) having the same pattern as a thin film to be formed is disposed to closely contact a substrate, and a thin film material is deposited over the FMM in order to form the thin film having the desired pattern.

SUMMARY

Aspects of the present invention provide a thin film deposition apparatus that may be easily manufactured, that may be simply applied to manufacture large-sized display devices on a mass scale, and that improves manufacturing yield and deposition efficiency; a method of manufacturing an organic light-emitting display device by using the thin film deposition apparatus, and an organic light-emitting display device manufactured using the method.

According to an aspect of the present invention, there is provided a thin film deposition apparatus for forming a thin film on a substrate, the apparatus including a deposition source that discharges a deposition material; a deposition source nozzle unit disposed at a side of the deposition source and including a plurality of deposition source nozzles arranged in a first direction; a patterning slit sheet disposed opposite to the deposition source nozzle unit and including a common deposition region at an end of the patterning slit sheet and a plurality of patterning slits on the other end in a second direction perpendicular to the first direction, where each of the plurality of pattering slits includes a plurality of patterning sub slits that are different in length; and a barrier plate assembly disposed between the deposition source nozzle unit and the patterning slit sheet in the first direction, and including a plurality of barrier plates that partition a deposition space between the deposition source nozzle unit and the patterning slit sheet into a plurality of sub-deposition spaces, wherein the thin film deposition apparatus is separated from the substrate by a predetermined distance, and the thin film deposition apparatus and the substrate are movable relative to each other.

Each of the plurality of patterning slits may include a first patterning sub slit having a first length, a second patterning sub slit having a second length that is different from the first length, and a third patterning sub slit having a third length that is different from the first and second lengths.

According to another aspect of the present invention, the first to third patterning sub slits may be alternately and repeatedly formed in the patterning slit sheet.

The first to third patterning slits may correspond to a red sub pixel region, a green sub pixel region, and a blue sub pixel region of the substrate, respectively. The first length may be longer than the second length and the second length is longer than the third length.

According to another aspect of the present invention, amounts of the deposition material deposited on regions of the substrate may be controlled according to the lengths of the first to third patterning sub slits.

The deposition material discharged from the deposition source may be subsequently deposited on the red, green, and blue sub pixel regions on the substrate.

The deposition material deposited on the red sub pixel region may be thicker than the deposition material deposited on the green pixel region, and the deposition material deposited on the green sub pixel region may be thicker than the deposition material deposited on the blue sub pixel region.

According to another aspect of the present invention, each of the barrier walls may extend in a second direction that is substantially perpendicular to the first direction, in order to partition the deposition space between the deposition source nozzle unit and the patterning slit sheet into the plurality of sub-deposition spaces.

According to another aspect of the present invention, the plurality of barrier plates may be arranged at equal intervals.

The barrier plate assembly may include a first barrier plate assembly including a plurality of first barrier plates and a second barrier plate assembly including a plurality of second barrier plates.

Each of the first barrier plates and the second barrier plates may extend in a second direction that is substantially perpendicular to the first direction, in order to partition the deposition space between the deposition source nozzle unit and the patterning slit sheet into the plurality of sub-deposition spaces.

The first barrier plates may be arranged to respectively correspond to the second barrier plates.

Each pair of the corresponding first and second barrier plates may be arranged on substantially the same plane.

The deposition material discharged from the thin film deposition apparatus may be continuously deposited on the substrate while the substrate is moved relative to the thin film deposition apparatus.

The thin film deposition apparatus or the substrate may be moved relative to each other along a plane parallel to a surface of the substrate on which the deposition material is deposited.

According to another aspect of the present invention, the barrier plate assembly may guide the deposition material discharged from the deposition source.

The patterning slit sheet of the thin film deposition apparatus may be smaller than the substrate.

According to another aspect of the present invention, there is provided a thin film deposition apparatus for forming a thin film on a substrate, the apparatus including a deposition source that discharges a deposition material; a deposition source nozzle unit disposed at a side of the deposition source and including a plurality of deposition source nozzles arranged in a first direction; and a patterning slit sheet disposed opposite to the deposition source nozzle unit and including a common deposition region at an end of the patterning slit sheet and a plurality of patterning slits on the other end in a second direction perpendicular to the first direction, where each of the plurality of pattering slits includes a plurality of patterning sub slits that are different in length, wherein deposition is performed while the substrate is moved relative to the thin film deposition apparatus in the first direction, and the deposition source, the deposition source nozzle unit, and the patterning slit sheet are formed integrally with one another.

Each of the plurality of patterning slits may include a first patterning sub slit having a first length, a second patterning sub slit having a second length that is different from the first length, and a third patterning sub slit having a third length that is different from the first and second lengths.

According to another aspect of the present invention, the first to third patterning sub slits may be alternately and repeatedly formed in the patterning slit sheet.

The first to third patterning slits may correspond to a red sub pixel region, a green sub pixel region, and a blue sub pixel region of the substrate, respectively, and the first length may be longer than the second length and the second length is longer than the third length.

Amounts of the deposition material deposited on regions of the substrate may be controlled according to the lengths of the first to third patterning sub slits.

The deposition material discharged from the deposition source may be subsequently deposited on the red, green, and blue sub pixel regions on the substrate.

The deposition material deposited on the red sub pixel region may be thicker than the deposition material deposited on the green sub pixel region, and the deposition material deposited on the green sub pixel region may be thicker than the deposition material deposited on the blue sub pixel region.

The patterning slit sheet of the thin film deposition apparatus may be smaller than the substrate.

The deposition source, the deposition source nozzle unit, and the patterning slit sheet may be formed integrally with one another by a connection unit.

According to another aspects of the present invention, the connection unit may guide movement of the discharged deposition material.

The connection unit may seal a space between the deposition source, the deposition source nozzle unit, and the patterning slit sheet.

The thin film deposition apparatus may be separated from the substrate by a predetermined distance.

The deposition material discharged from the thin film deposition apparatus may be continuously deposited on the substrate while the substrate is moved relative to the thin film deposition apparatus in the first direction.

According to another aspect of the present invention, there is provided a method of manufacturing an organic light-emitting display device, the method including performing deposition on a substrate that is a deposition target while a thin film deposition apparatus and the substrate are moved relative to each other. The substrate is fixedly supported by a chuck and the thin film deposition apparatus is disposed apart from the substrate. The thin film deposition apparatus includes a deposition source that discharges a deposition material; a deposition source nozzle unit disposed at a side of the deposition source and including a plurality of deposition source nozzles arranged in a first direction; a patterning slit sheet disposed opposite to the deposition source nozzle unit and including a common deposition region at an end of the patterning slit sheet and a plurality of patterning slits on the other end in a second direction perpendicular to the first direction, where each of the plurality of pattering slits includes a plurality of patterning sub slits that are different in length; and a barrier plate assembly disposed between the deposition source nozzle unit and the patterning slit sheet in the first direction, and including a plurality of barrier plates that partition a deposition space between the deposition source nozzle unit and the patterning slit sheet into a plurality of sub-deposition spaces.

The deposition material may include an organic material. The thin film deposition apparatus may further include a plurality of capping layers corresponding to a sub pixel emitting red light, a sub pixel emitting green light, and a sub pixel emitting blue light, respectively, where the plurality of capping layers have different thicknesses from one another.

According to another aspect of the present invention, there is provided an organic light-emitting display device manufactured using the method.

According to another aspect of the present invention, there is provided a method of manufacturing an organic light-emitting display device, the method including performing deposition on a substrate that is a deposition target while a thin film deposition apparatus and the substrate are moved relative to each other, wherein the substrate is fixedly supported by a chuck and the thin film deposition apparatus is disposed apart from the substrate. The thin film deposition apparatus includes a deposition source that discharges a deposition material; a deposition source nozzle unit disposed at a side of the deposition source and including a plurality of deposition source nozzles arranged in a first direction; and a patterning slit sheet disposed opposite to the deposition source nozzle unit and including a common deposition region at an end of the patterning slit sheet and a plurality of patterning slits on the other end in a second direction perpendicular to the first direction, where each of the plurality of pattering slits includes a plurality of patterning sub slits that are different in length.

The deposition material may include an organic material. The thin film deposition apparatus may further include a plurality of capping layers corresponding to a sub pixel emitting red light, a sub pixel emitting green light, and a sub pixel emitting blue light, respectively, where the plurality of capping layers have different thicknesses from one another.

According to another aspect of the present invention, there is provided an organic light-emitting display device manufactured using the method.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION

Figure 1:
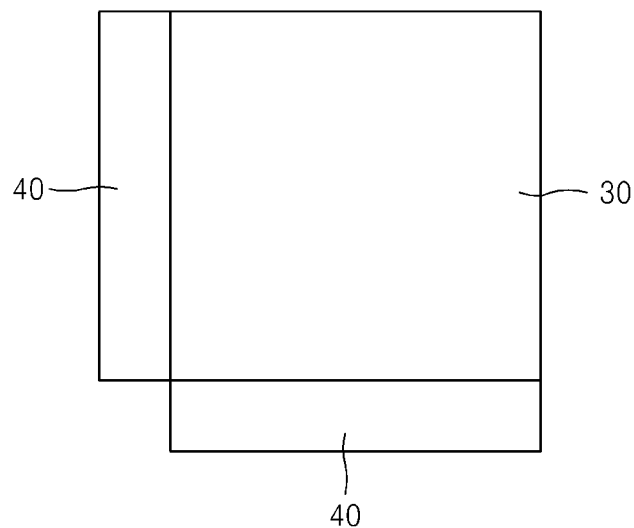
FIG. 1 is a plan view of an organic light-emitting display device manufactured by using a thin film deposition apparatus, according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

FIG. 1 is a plan view of an organic light-emitting display device manufactured by using a thin film thin film deposition apparatus, according to an embodiment of the present invention. Referring to FIG. 1, the organic light-emitting display device includes a pixel region 30 and circuit regions 40 disposed at edges of the pixel region 30. The pixel region 30 includes a plurality of pixels, and each of the pixels includes an emission unit that emits light to display an image.

In an embodiment of the present invention, the emission unit may include a plurality of sub-pixels, each of which includes an organic light-emitting diode (OLED). In a full-color organic light-emitting display device, red (R), green (G) and blue (B) sub-pixels are arranged in various patterns, for example, in a line, mosaic, or lattice pattern, to constitute a pixel. The organic light-emitting display device according to an aspect of the present invention may include a monochromatic flat display device.

The circuit regions 40 control, for example, an image signal that is input to the pixel region 30. In the organic light-emitting display device according to an aspect of the present invention, at least one thin film transistor (TFT) may be installed in each of the pixel region 30 and the circuit region 40.

The at least one TFT installed in the pixel region 30 may include a pixel TFT, such as a switching TFT that transmits a data signal to an OLED according to a gate line signal to control the operation of the OLED, and a driving TFT that drives the OLED by supplying current according to the data signal. The at least one TFT installed in each of the circuit regions 40 may include a circuit TFT formed to implement a predetermined circuit.

The number and arrangement of TFTs may vary according to the features of the display device and a driving method thereof.

Figure 2:
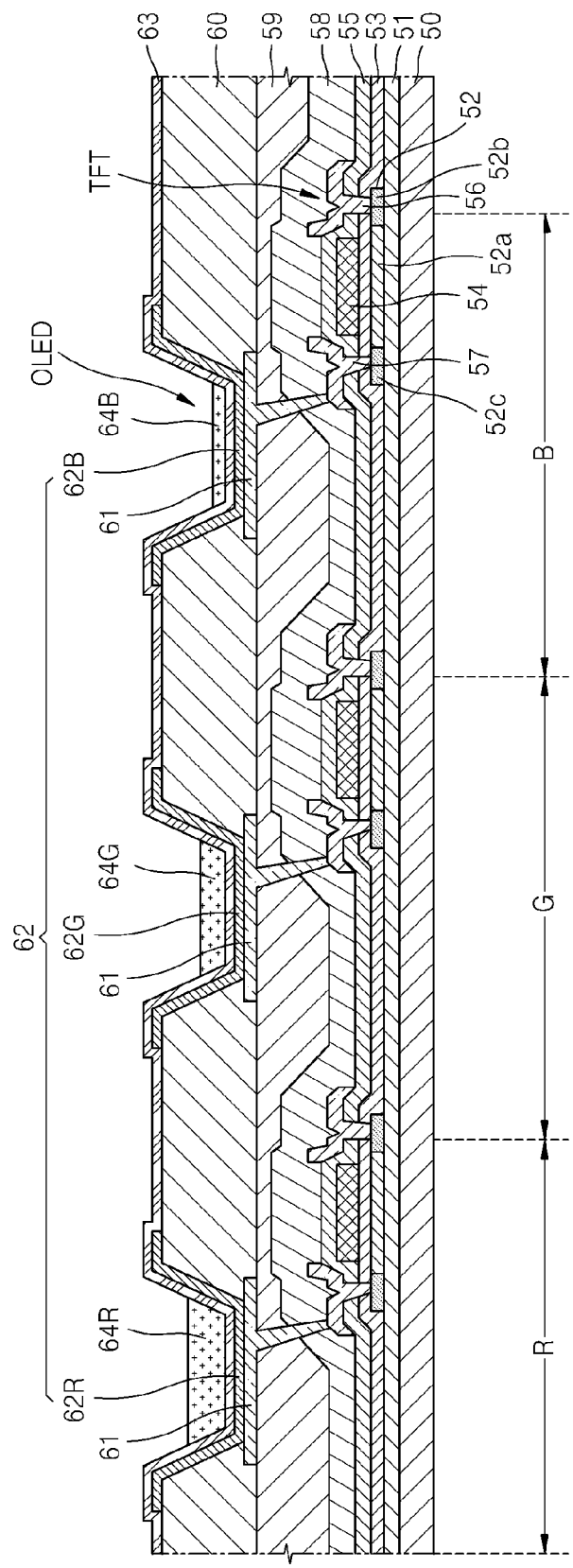
FIG. 2 is a cross-sectional view of one of the pixels of the organic light-emitting display device illustrated in FIG. 1, according to an embodiment of the present invention.

FIG. 2 is a sectional view of one of the pixels of the organic light-emitting display device illustrated in FIG. 1, according to an embodiment of the present invention. Referring to FIG. 2, a buffer layer 51 is formed on a substrate 50 formed of glass or plastic. A TFT and an OLED are formed on the buffer layer 51.

An active layer 52 having a predetermined pattern is formed on the buffer layer 51. A gate insulating layer 53 is formed on the active layer 52, and a gate electrode 54 is formed in a predetermined region of the gate insulating layer 53. The gate electrode 54 is connected to a gate line (not shown) that applies a TFT ON/OFF signal. An interlayer insulating layer 55 is formed on the gate electrode 54. Source/drain electrodes 56 and 57 are formed such as to contact source/drain regions 52$b$ and 52$c$ of the active layer 52 through contact holes, respectively. A gate region 52$a$ is disposed between the source/drain regions 52$b$ and 52$c$. A passivation layer 58 is formed of $SiO_2$, $SiN_x$, or the like, on the source/drain electrodes 56 and 57. A planarization layer 59 is formed of an organic material, such as acryl, polyimide, benzocyclobutene (BCB), or the like, on the passivation layer 58. A pixel electrode 61, which functions as an anode of the OLED, is formed on the planarization layer 59, and a pixel defining layer 60 is formed of an organic material to cover the pixel electrode 61. An opening is formed in the pixel defining layer 60, and then an organic layer 62 is formed on the pixel defining layer 60 and the pixel electrode 61 that is exposed through the opening. The organic layer 62 includes a plurality of emission layers 62R, 62G, and 62B. However, the aspects of the present invention are not limited to the structure of the organic light-emitting display device described above, and various structures of organic light-emitting display devices may be applied to the aspects of the present invention.

The OLED displays predetermined image information by emitting red, green and blue light as current flows. The OLED includes the pixel electrode 61, which is connected to a drain electrode 57 of the TFT and to which a positive power voltage is applied, a second electrode 63, which is formed to cover all the pixels and to which a negative power voltage is applied, the organic layer 62, which is disposed between the pixel electrode 61 and the second electrode 63 to emit light, and a plurality of capping layers (CPL) 64R, 64G, and 64B formed on the second electrode 63 to correspond to a plurality of sub pixels, respectively.

The first and second electrode 61 and 63 are insulated from each other by the organic layer 62, and respectively apply voltages of opposite polarities to the organic layer 62 to induce light emission in the organic layer 62.

The organic layer 62 may include a low-molecular weight organic layer or a high-molecular weight organic layer. When a low-molecular weight organic layer is used as the organic layer 62, the organic layer 62 may have a single or multi-layer structure including at least one selected from the group consisting of a hole injection layer (HIL), a hole transport layer (HTL), an emission layer (EML), an electron transport layer (ETL), and an electron injection layer (EIL). The low-molecular weight organic layer may be formed by vacuum deposition.

When a high-molecular weight organic layer is used as the organic layer 62, the organic layer 62 may mostly have a structure including a HTL and an EML. In this case, the HTL may be formed of poly(ethylenedioxythiophene) (PEDOT), and the EML may be formed of, for example, a polyphenylenevinylenes (PPVs) or polyfluorenes-based high-molecular weight organic material. The HTL and the EML may be formed by screen printing, inkjet printing, or the like.

The organic layer 62 is not limited to the organic layers described above and may be embodied in various ways.

The first electrode 61 functions as an anode, and the second electrode 63 functions as a cathode. Alternatively, the first electrode 61 may function as a cathode, and the second electrode 63 may function as an anode.

The first electrode 61 may be formed as a transparent electrode or a reflective electrode. Such a transparent electrode may be formed of an indium tin oxide (ITO), an indium zinc oxide (IZO), a zinc oxide (ZnO), or an indium oxide ($In_2O_3$) Such a reflective electrode may be formed by forming a reflective layer of silver (Ag), magnesium (Mg), aluminum (Al), platinum (Pt), palladium (Pd), gold (Au), nickel (Ni), neodymium (Nd), iridium (Ir), chromium (Cr) or a compound thereof and forming a layer of ITO, IZO, ZnO, or $In_2O_3$ on the reflective layer.

The second electrode 63 may also be formed as a transparent electrode or a reflective electrode. When the second electrode 63 is formed as a transparent electrode, the second electrode 63 functions as a cathode. To this end, such a transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof on a surface of the organic layer 62 and forming an auxiliary electrode layer or a bus electrode line thereon from a transparent electrode forming material, such as ITO, IZO, ZnO, $In_2O_3$, or the like. When the second electrode 63 is formed as a reflective electrode, the reflective layer may be formed by depositing Li, Ca, LiF/Ca, LiF/Al, Al, Ag, Mg, or a compound thereof on the entire surface of the organic layer 62.

The capping layers (CPL) 64R, 64G, and 64B increase the brightness of the OLED and have thicknesses suitable for emitting red, green, and blue lights, respectively. A low or high molecular weight organic layer may be used for each of the capping layers (CPL) 64R, 64G, and 64B, and the same material used to form the organic layer 62 may also be used to form the capping layers (CPL) 64R, 64G, and 64B.

In the organic light-emitting display apparatus described above, the organic layer 62 including the emission layers 62R, 62G, and 62B and the capping layers (CPL) 64R, 64G, and 64B may be formed by using a thin film deposition apparatus 100 (see FIG. 3), which will be described later.

In the organic light-emitting display device manufactured with the thin film deposition apparatus according to an aspect of the present invention, the capping layers (CPL) 64R, 64G, and 64B corresponding to R, G, and B sub-pixels that emit red, green and blue light, respectively, have different thicknesses.

In detail, the first or second electrode 61 or 63 is a reflective electrode and the other electrode is a semi-transparent or transparent electrode. Thus, oscillation may occur between the first and second electrodes 61 and 63 when the organic light-emitting display device is driven. Since the first or second electrode 61 or 63 is a reflective electrode and the other is a semi-transparent or transparent electrode, when the organic light-emitting display device is driven, lights generated by the respective emission layers 62R, 62G, and 62B between the first and second electrodes 61 and 63 are emitted outside the organic light-emitting display device while oscillating between the first and second electrodes 61 and 63, thereby increasing the luminance and efficiency of light emission. In this case, the thicknesses of the emission layers 62R, 62G, and 62B for respective red, green, and blue lights may be different from one another in order to maximize oscillation efficiency. Accordingly, the capping layers (CPL) 64R, 64G, and 64B corresponding to the sub-pixels that emit red, green, and blue lights, respectively, may be formed to different thicknesses.

TABLE 1

|  | R | G | B |
|---|---|---|---|
| CPL efficiency (cd/A) when the capping layers (CPL) 64R, 64G, and 64B have the same thickness | 30.8 | 40.2 | 2.6 |
| CPL efficiency (cd/A) when the thicknesses of the capping layers (CPL) 64R, 64G, and 64B are optimally determined | 30.8 | 43.4 | 3.9 |
| White Efficiency | | 16.9 -> 21.5 | |

Table 1 shows data representing white efficiency when the thicknesses of the capping layers (CPL) 64R, 64G, and 64B are optimally determined. Referring to Table 1, white efficiency when the thicknesses of the capping layers (CPL) 64R, 64G, and 64B corresponding to the sub-pixels that emit red, green, and blue lights, respectively, are optimally determined, is improved by 30% or higher than when the thicknesses of the capping layers (CPL) 64R, 64G, and 64B are the same.

That is, oscillation may occur between the first and second electrodes 61 and 63 when the organic light-emitting display device is driven. However, since the capping layers (CPL) 64R, 64G, and 64B disposed between the first and second electrodes 61 and 63 have thicknesses optimal for the respective colors of lights emitted by the emission layers 62R, 62G, and 62B, the organic light-emitting display devices may have improved driving voltage, current density, brightness, color purity, light-emission efficiency, and lifetime.

The capping layers (CPL) 64R, 64G, and 64B may be formed by performing only a process using a thin film deposition apparatus according to an embodiment of the present invention. This will be described in detail later.

A thin film deposition apparatus and a method of manufacturing an organic light-emitting display device by using the thin film deposition apparatus according to an embodiment of the present invention will now be described in detail.

Figure 3:
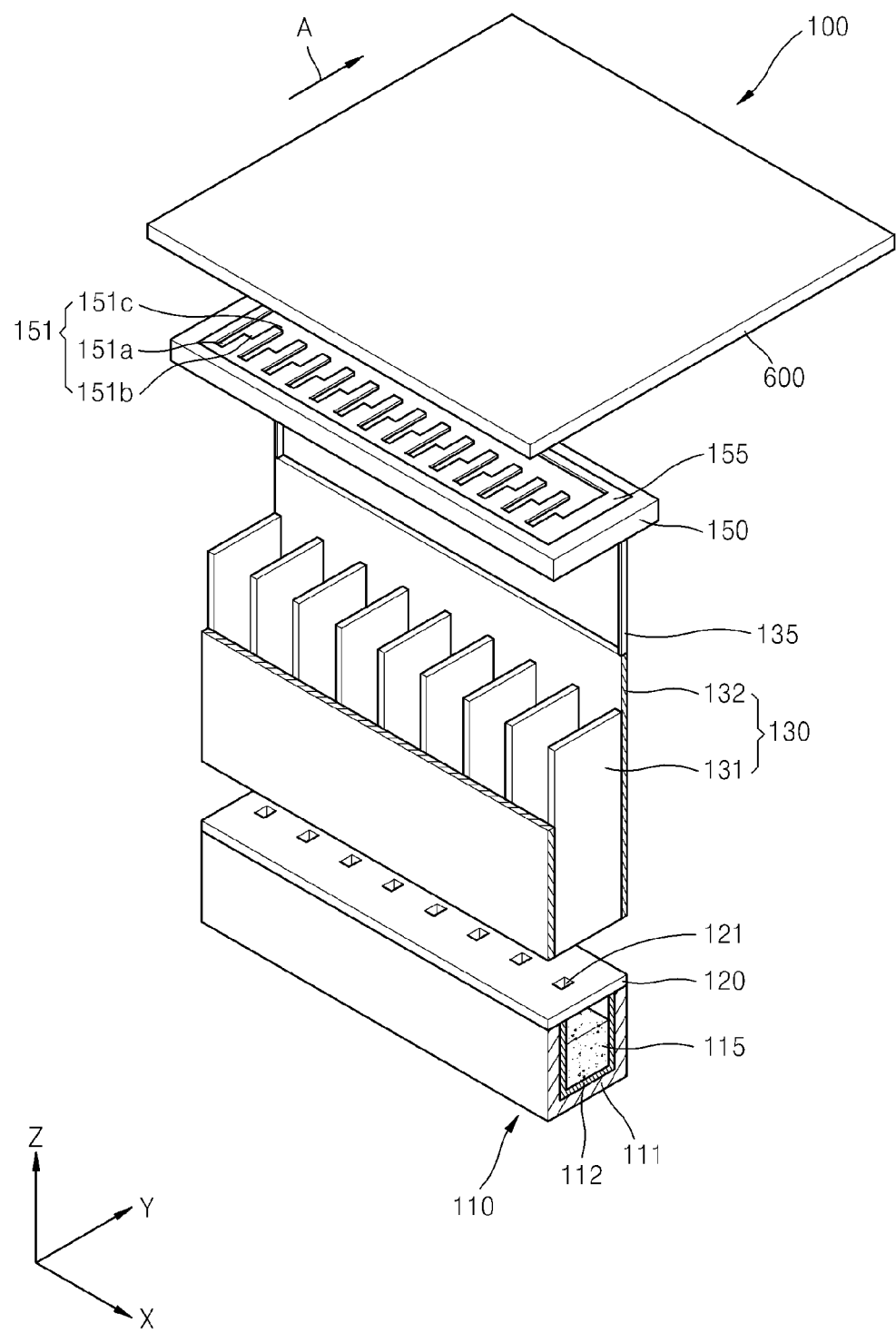
FIG. 3 is a schematic perspective view of a thin film deposition apparatus according to another embodiment of the present invention.
Figure 4:
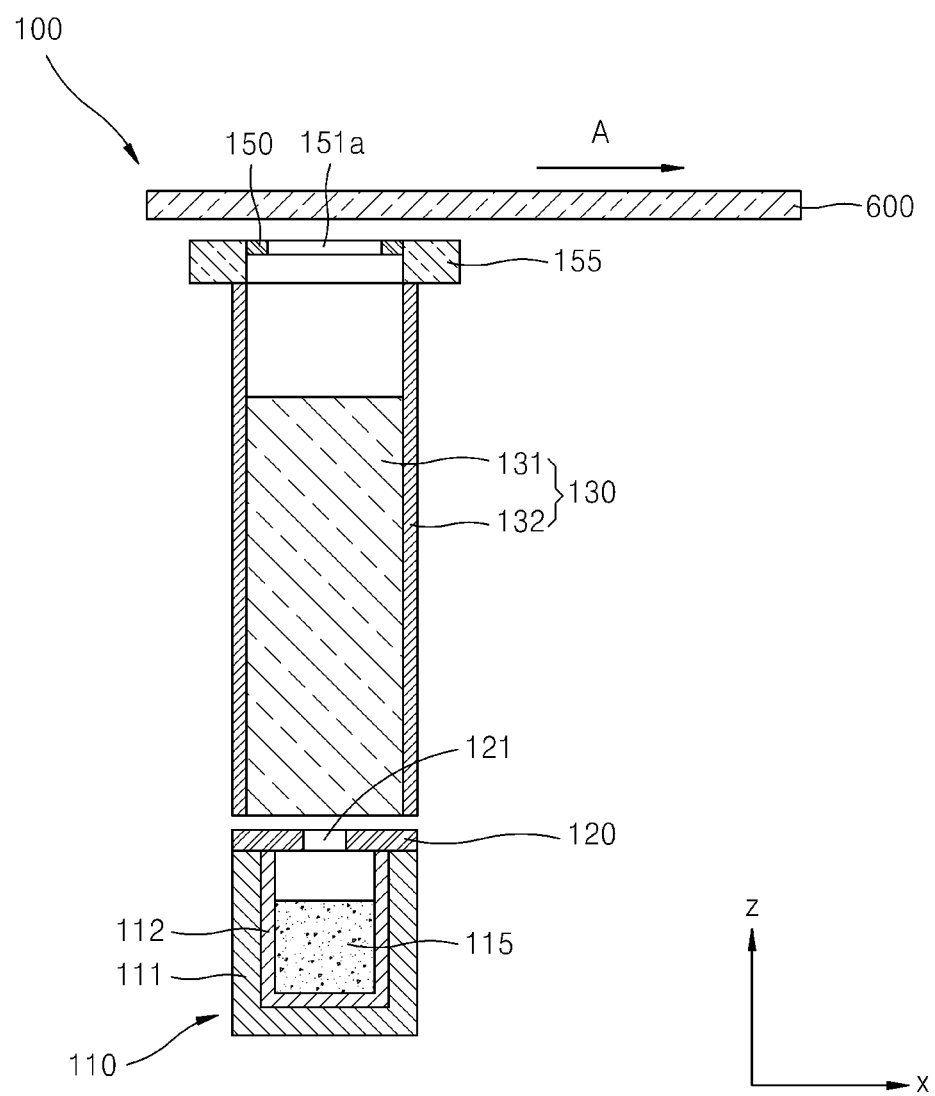
FIG. 4 is a schematic side view of the thin film deposition apparatus illustrated in FIG. 3, according to an embodiment of the present invention.
Figure 5:
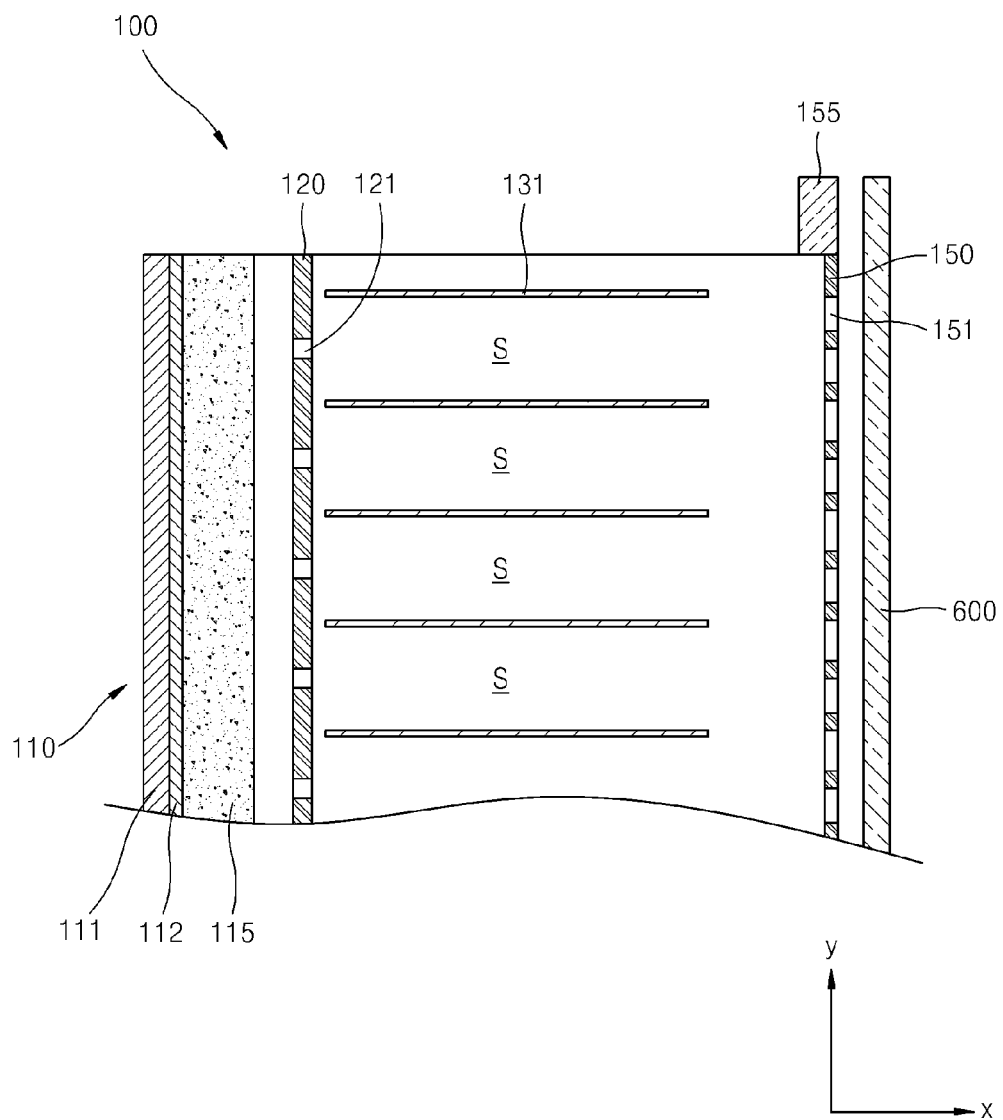
FIG. 5 is a schematic plan view of the thin film deposition apparatus illustrated in FIG. 3, according to an embodiment of the present invention.

FIG. 3 is a schematic perspective view of a thin film deposition apparatus 100 according to an embodiment of the present invention. FIG. 4 is a schematic side view of the thin film deposition apparatus 100 of FIG. 3. FIG. 5 is a schematic plan view of the thin film deposition apparatus 100 of FIG. 3.

Referring to FIGS. 3, 4 and 5, the thin film deposition apparatus 100 includes a deposition source 110, a deposition source nozzle unit 120, a barrier plate assembly 130, and a patterning slit sheet 150.

Although a chamber is not illustrated in FIGS. 3, 4 and 5 for convenience of explanation, all the components of the thin film deposition apparatus 100 may be disposed within a chamber that is maintained at an appropriate degree of vacuum. The chamber is maintained at an appropriate vacuum in order to allow a deposition material to move in a substantially straight line through the thin film deposition apparatus 100.

A substrate 600 that is a deposition target on which a deposition material 115 is to be deposited, is disposed in the chamber. The substrate 600 may be a substrate for flat panel displays. A large substrate, such as a mother glass, for manufacturing a plurality of flat panel displays, may be used as the substrate 600. Other substrates may also be employed.

According to an aspect of the present invention, deposition may be performed while the substrate 600 is moved relative to the thin film deposition apparatus 100, but the invention is not limited thereto. Therefore, deposition may also be performed while the thin film deposition apparatus 100 is moved relative to the substrate 600.

In particular, in a conventional FMM deposition method, the size of an FMM has to be equal to the size of a substrate. Thus, the size of the FMM has to be increased as the substrate becomes larger. However, it is neither straightforward to manufacture a large FMM nor to extend an FMM to be accurately aligned with a pattern.

In order to overcome this problem, in the thin film deposition apparatus 100 according to an aspect of the present invention, deposition may be performed while the thin film deposition apparatus 100 or the substrate 600 is moved relative to each other. In other words, deposition may be continuously performed while the substrate 600 disposed to face the thin film deposition apparatus 100 is moved in a Y-axis direction. That is, deposition is performed in a scanning manner while the substrate 600 is moved in a direction of arrow A in FIG. 3. Although the substrate 600 is illustrated as being moved in the Y-axis direction in FIG. 3 when deposition is performed, the aspects of the present invention are not limited thereto and as noted above deposition may be performed while the thin film deposition apparatus 100 is moved in the Y-axis direction, whereas the substrate 600 is fixed.

Thus, in the thin film deposition apparatus 100, the patterning slit sheet 150 may be significantly smaller than the FMM used in the conventional deposition method. That is, in the thin film deposition apparatus 100, deposition is continuously performed, i.e., in a scanning manner while the substrate 600 is moved in the Y-axis direction. Thus, lengths of the patterning slit sheet 150 may be significantly less than the lengths of the substrate 600, in the X-axis and Y-axis directions. As described above, since the patterning slit sheet 150 may be formed to be significantly smaller than the FMM used in the conventional deposition method, it is relatively easy to manufacture the patterning slit sheet 150 according to an aspect of the present invention. In other words, using the patterning slit sheet 150, which is smaller than the FMM used in the conventional deposition method, is more convenient in all processes, including etching and subsequent other processes, such as precise extension, welding, moving, and cleaning processes, compared to the conventional deposition method using the larger FMM. This is more advantageous for a relatively large display device.

In order to perform deposition while the thin film deposition apparatus 100 or the substrate 600 is moved relative to each other as described above, the thin film deposition apparatus 100 and the substrate 600 may be separated from each other by a predetermined distance. This will be described later in detail.

The deposition source 110 that contains and heats the deposition material 115 is disposed in an opposite side of the chamber to that in which the substrate 600 is disposed. As the deposition material 115 contained in the deposition source 110 is vaporized, the deposition material 115 is deposited on the substrate 600.

In particular, the deposition source 110 includes a crucible 111 that is filled with the deposition material 115, and a heater 112 that heats the crucible 111 to vaporize the deposition material 115, which is contained in the crucible 111, towards a side of the crucible 111, and in particular, towards the deposition source nozzle unit 120.

The deposition source nozzle unit 120 is disposed at a side of the deposition source 110, and in particular, at the side of the deposition source 110 facing the substrate 600. The deposition source nozzle unit 120 includes a plurality of deposition source nozzles 121 arranged in the X-axis direction. The deposition material 115 that is vaporized in the deposition source 110, passes through the deposition source nozzle unit 120 towards the substrate 600.

The barrier plate assembly 130 is disposed at a side of the deposition source nozzle unit 120. The barrier plate assembly 130 includes a plurality of barrier plates 131, and a barrier plate frame 132 that covers sides of the barrier plates 131. The plurality of barrier plates 131 may be arranged parallel to each other at equal intervals in X-axis direction. In addition, each of the barrier plates 131 may be arranged parallel to an YZ plane in FIG. 3, i.e., perpendicular to the X-axis direction. The plurality of barrier plates 131 arranged as described above partition the deposition space between the deposition source nozzle unit 120 and the patterning slit sheet 150 into a plurality of sub-deposition spaces S (see FIG. 5). In the thin film deposition apparatus 100, the deposition space is divided by the barrier plates 131 into the sub-deposition spaces S that respectively correspond to the deposition source nozzles 121 through which the deposition material 115 is discharged.

The barrier plates 131 may be respectively disposed between adjacent deposition source nozzles 121. In other words, each of the deposition source nozzles 121 may be disposed between two adjacent barrier plates 131. The deposition source nozzles 121 may be respectively located at the midpoint between two adjacent barrier plates 131. As described above, since the barrier plates 131 partition the deposition space between the deposition source nozzle unit 120 and the patterning slit sheet 150 into the plurality of sub-deposition spaces S, the deposition material 115 discharged through each of the deposition source nozzles 121 is not mixed with the deposition material 115 discharged through the other deposition source nozzles slits 121, and passes through patterning slits 151 so as to be deposited on the substrate 600. In other words, the barrier plates 131 guide the deposition material 115, which is discharged through the deposition source nozzles slits 121, to move straight, not to flow in the X-axis direction.

As described above, the deposition material 115 is forced to move straight by installing the barrier plates 131, so that a smaller shadow zone may be formed on the substrate 600 compared to a case where no barrier plates are installed. Thus, the thin film deposition apparatus 100 and the substrate 600 may be separated from each other by a predetermined distance. This will be described later in detail.

The barrier plate frame 132, which covers upper and lower sides of the barrier plates 131, maintains the positions of the barrier plates 131, and guides the deposition material 115, which is discharged through the deposition source nozzles 121, not to flow in the Y-axis direction.

The barrier plate assembly 130 may be constructed to be detachable from the thin film deposition apparatus 100. A conventional FMM deposition method has low deposition efficiency. In order to overcome this problem, in the thin film deposition apparatus 100, the deposition space is enclosed by using the barrier plate assembly 130, so that the deposition material 115 that remains undeposited is mostly deposited within the barrier plate assembly 130. Thus, since the barrier plate assembly 130 is constructed to be detachable from the thin film deposition apparatus 100, when a large amount of the deposition material 115 lies in the barrier plate assembly 130 after a long deposition process, the barrier plate assembly 130 may be detached from the thin film deposition apparatus 100 and then placed in a separate deposition material recycling apparatus in order to recover the deposition material 115. Due to the structure of the thin film deposition apparatus 100, a reuse rate of the deposition material 115 is increased, improving the deposition efficiency, thus reducing manufacturing costs.

The patterning slit sheet 150 and a frame 155 are disposed between the deposition source 110 and the substrate 600. The frame 155 may be formed in a lattice shape, similar to a window frame. The patterning slit sheet 150 bounds the frame 155. The patterning slit sheet 150 includes a plurality of patterning slits 151 arranged in the X-axis direction. The deposition material 115 that is vaporized in the deposition source 110, passes through the deposition source nozzle unit 120 and the patterning slit sheet 150 towards the substrate 600. The patterning slit sheet 150 may be manufactured by etching, which is the same method as used in the conventional method of manufacturing the FMM, and in particular, a striped FMM.

Each of the patterning slits 151 includes a plurality of patterning sub slits 151*a* to 151*c* that are different in lengths. This will be described in detail with reference to FIG. 6 later.

In the thin film deposition apparatus 100, the total number of patterning slits 151 may be greater than the total number of deposition source nozzles 121. In addition, there may be a greater number of patterning slits 151 than deposition source nozzles 121 disposed between two adjacent barrier plates 131.

In other words, one deposition source nozzle 121 may be disposed between each two adjacent barrier plates 131. Meanwhile, a plurality of patterning slits 151 may be disposed between each two adjacent barrier plates 131. The deposition space between the deposition source nozzle unit 120 and the patterning slit sheet 150 is partitioned by the barrier plates 131 into sub-deposition spaces S that correspond to the deposition source nozzles 121, respectively. Thus, the deposition material 115 discharged from each of the deposition source nozzles 121 passes through a plurality of patterning slits 151 disposed in the sub-deposition space S corresponding to the deposition source nozzle 121, and is then deposited on the substrate 600.

The barrier plate assembly 130 and the patterning slit sheet 150 may be formed to be separated from each other by a predetermined distance. Alternatively, the barrier plate assembly 130 and the patterning slit sheet 150 may be connected by a connection unit 135. The temperature of the barrier plate assembly 130 may increase to 100° C. or higher due to the deposition source 110 whose temperature is high. Thus, in order to prevent the heat of the barrier plate assembly 130 from being conducted to the patterning slit sheet 150, the barrier plate assembly 130 and the patterning slit sheet 150 are separated from each other by the predetermined distance.

As described above, the thin film deposition apparatus 100 performs deposition while being moved relative to the substrate 600. In order to move the thin film deposition apparatus 100 relative to the substrate 600, the patterning slit sheet 150 is separated from the substrate 600 by the predetermined distance. In order to prevent the formation of a relatively large shadow zone on the substrate 600 when the patterning slit sheet 150 and the substrate 400 are separated from each other, the barrier plates 131 are arranged between the deposition source nozzle unit 120 and the patterning slit sheet 150 to force the deposition material 115 to move in a straight direction. Thus, the size of the shadow zone formed on the substrate 400 is sharply reduced.

More specifically, in the conventional deposition method using the FMM, deposition is performed with the FMM in close contact with a substrate in order to prevent formation of a shadow zone on the substrate. However, when the FMM is used in close contact with the substrate, the contact may cause defects. In addition, in the conventional deposition method, the size of the mask has to be the same as the size of the substrate since the mask cannot be moved relative to the substrate. Thus, the size of the mask has to be increased as display devices become larger but it is not easy to manufacture such a large mask.

In order to overcome this problem, in the thin film deposition apparatus 100, the patterning slit sheet 150 is disposed to be separated from the substrate 600 by the predetermined distance. This may be facilitated by installing the barrier plates 131 to reduce the size of the shadow zone formed on the substrate 600.

As described above, according to an aspect of the present invention, a mask is formed to be smaller than a substrate, and deposition is performed while the mask is moved relative to the substrate. Thus, the mask can be easily manufactured. In addition, defects caused due to the contact between a substrate and a FMM, which occurs in the conventional deposition method, may be prevented. In addition, since it is unnecessary to use the FMM in close contact with the substrate during a deposition process, the manufacturing speed may be improved. As described above, the shadow zone formed on the substrate 600 may be reduced by installing the barrier plates 131. Thus, the patterning slit sheet 150 can be separated from the substrate 600.

Hereinafter, the patterning slit sheet 150 included in the thin film deposition apparatus 100 of FIG. 3 will be described in detail.

Figure 6:
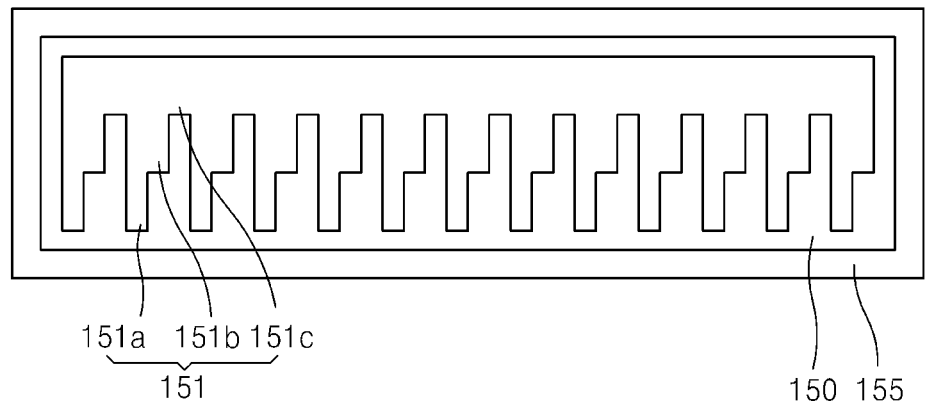
FIG. 6 is a plan view of a patterning slit sheet included in the thin film deposition apparatus of FIG. 3, according to an embodiment of the present invention.

FIG. 6 is a plan view of the patterning slit sheet 150 included in the thin film deposition apparatus 100 of FIG. 3, according to an embodiment of the present invention. Referring to FIG. 6, in the patterning slit sheet 150, each of the patterning slits 151 includes the plurality of patterning sub slits 151*a* to 151*c* that are different in length.

As described above, in the organic light-emitting display device of FIG. 2, the capping layers 64R, 64G, and 64B corresponding to sub pixels that emit red, green, and blue lights, respectively, have different thicknesses from one another. That is, the thickness of the capping layer 64R corresponding to a red sub pixel that emits red light may be relative thick, the thickness of the capping layer 64G corresponding to a green sub pixel that emits green light may be thinner than that of the capping layer 64R, and the thickness of the capping layer 64B corresponding to a blue sub pixel that emits blue light may be thinner than that of the capping layer 64G.

In a conventional FMM deposition method, only one layer can be formed at a time, and in general, a capping layer corresponding to a red sub pixel that emits red light, a capping layer corresponding to a green sub pixel that emits green light, and a capping layer corresponding to a blue sub pixel that emits blue light are therefore formed separately.

However, in the organic light-emitting display device of FIG. 2, the capping layers 64R, 64G, and 64B are formed of the same material and are different from one another only in terms of their location and thickness. Thus, in the thin film deposition apparatus 100 of FIG. 3, the capping layers 64R, 64G, and 64B that correspond to the red, green, and blue sub pixels, respectively, are formed subsequently in such a manner that regions of each of the patterning slits 151, which correspond to red, green, and blue sub pixel regions, respectively, are different from one another in length.

Specifically, each of the patterning slits 151 includes a first patterning slit 151*a*, a second patterning slit 151*b*, and a third patterning slit 151*c*. The first patterning slit 151*a* corresponds to the red sub pixel region, the second patterning slit 151*b* corresponds to the green sub pixel region, and the third patterning slit 151*c* corresponds to the blue sub pixel region. That is, referring to FIG. 5, since the deposition material 115 that passes through the patterning slits 151 is deposited on the substrate 600, the greater the patterning slit 151, the thicker an organic layer to be formed on the substrate 600. Thus, the first patterning slit 151*a* for forming the capping layer 64R corresponding to the red sub pixel, the thickness of which is relatively thick is the longest, the second patterning slit 151*b* for forming the capping layer 64G corresponding to the green sub pixel, the thickness of which is thinner than the capping layer 64R is shorter than the first patterning slit 151*a*, and the third patterning slit 151*c* for forming the capping layer 64B corresponding to the blue sub pixel, the thickness of which is thinner than the capping layer 64R is shorter than the second patterning slit 151*b*.

In other words, referring to FIG. 6, it would also be understood that the patterning slit sheet 150 is formed in such a manner that an upper portion of the patterning slit sheet 150 may be used as a common deposition region and a plurality of slits having different lengths, which correspond to the red, green, and blue sub pixels, respectively, are alternately and repeatedly formed in a lower portion of the patterning slit 151.

As described above, according to an embodiment of the present invention, each of patterning slits has sub patterning slits that are different in length, in which long patterning sub slits correspond to portions of a substrate on which a large amount of a deposition material is to be deposited so that the large amount of the deposition material may pass through the long patterning slits, and short patterning sub slits correspond to portions of the substrate on which a small amount of the deposition material is to be deposited so that the small amount of the deposition material may pass through the short patterning slits. Accordingly, two layers may be formed at a time, thereby reducing the total number of thin film deposition apparatuses needed, reducing a time needed to manufacture the thin film deposition apparatuses, and simplifying equipment for manufacturing the thin film deposition apparatuses.

Figure 7:
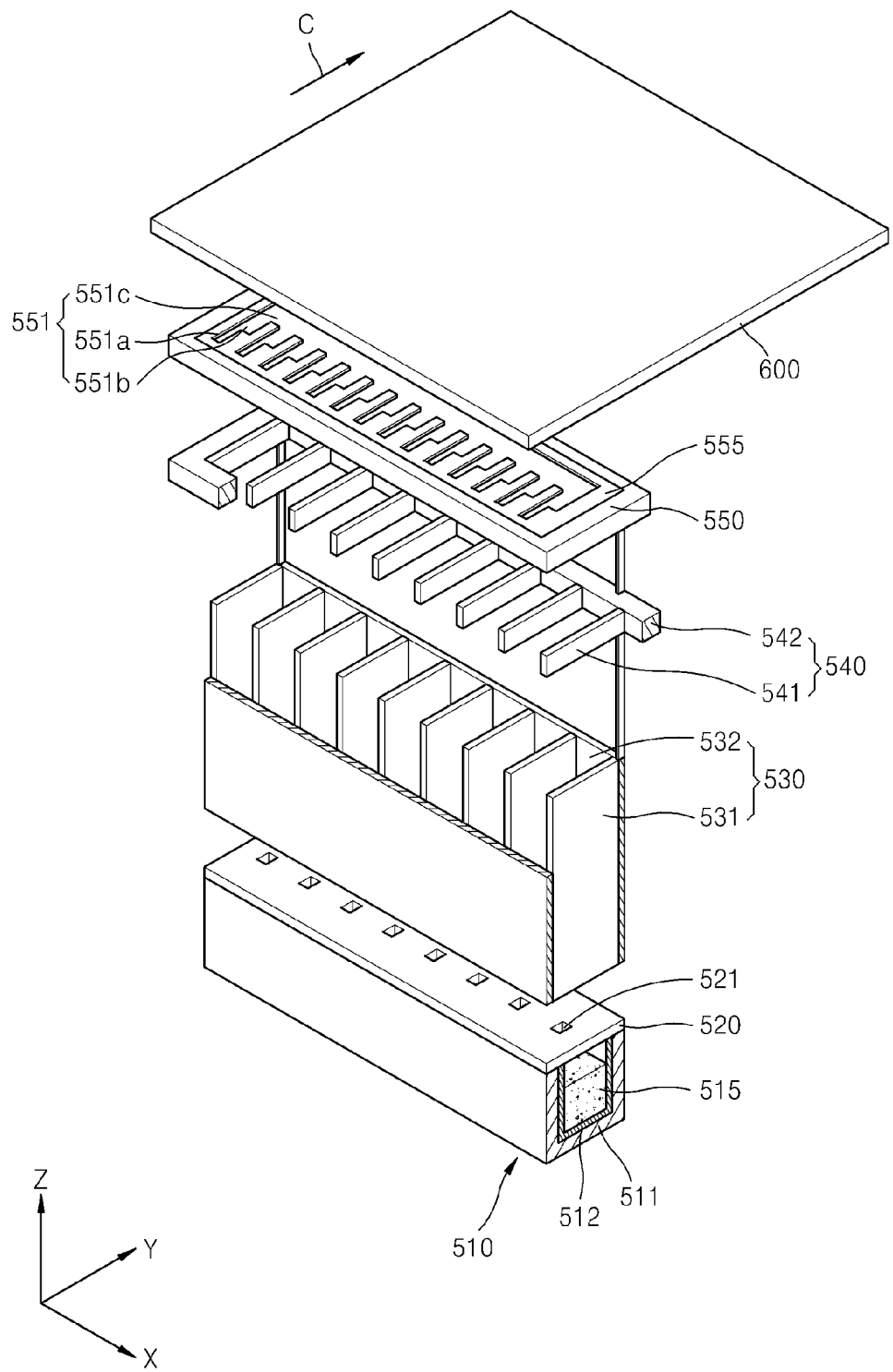
FIG. 7 is a schematic perspective view of a thin film deposition apparatus according to another embodiment of the present invention.

FIG. 7 is a schematic perspective view of a thin film deposition apparatus 500 according to another embodiment of the present invention. Referring to FIG. 7, the thin film deposition apparatus 500 includes a deposition source 510, a deposition source nozzle unit 520, a first barrier plate assembly 530, a second barrier plate assembly 540, a patterning slit sheet 550, and a substrate 600.

Although a chamber is not illustrated in FIG. 7 for convenience of explanation, all the components of the thin film deposition apparatus 500 may be disposed within a chamber that is maintained at an appropriate degree of vacuum. The chamber is maintained at an appropriate vacuum in order to allow a deposition material to move in a substantially straight line through the thin film deposition apparatus 500.

The substrate 600 that is a deposition target is disposed in the chamber. The deposition source 510 that contains and heats a deposition material 515 is disposed in an opposite side of the chamber to that in which the substrate 600 is disposed. The deposition source 510 may include a crucible 511 and a heater 512.

The deposition source nozzle unit 520 is disposed at a side of the deposition source 510, and in particular, at the side of the deposition source 510 facing the substrate 600. The deposition source nozzle unit 520 includes a plurality of deposition source nozzles 521 arranged in the X-axis direction.

The first barrier plate assembly 530 is disposed at a side of the deposition source nozzle unit 520. The first barrier plate assembly 530 includes a plurality of first barrier plates 531, and a first barrier plate frame 532 that covers sides of the first barrier plates 531.

The second barrier plate assembly 540 is disposed at a side of the first barrier plate assembly 530. The second barrier plate assembly 540 includes a plurality of second barrier plates 541, and a second barrier plate frame 542 that covers sides of the second barrier plates 541.

The patterning slit sheet 550 and a frame 555 in which the patterning slit sheet 550 is bound are disposed between the deposition source 510 and the substrate 600. The frame 555 may be formed in a lattice shape, similar to a window frame. The patterning slit sheet 550 includes a plurality of patterning slits 551 arranged in the X-axis direction.

The thin film deposition apparatus 500 includes two separate barrier plate assemblies, i.e., the first barrier plate assembly 530 and the second barrier plate assembly 540.

The plurality of first barrier plates 531 may be arranged parallel to each other at equal intervals in the X-axis direction. Each of the first barrier plates 531 may be formed to extend along an YZ plane in FIG. 7, i.e., perpendicular to the X-axis direction.

The plurality of second barrier plates 541 may be arranged parallel to each other at equal intervals in the X-axis direction. In addition, each of the second barrier plates 541 may be formed to extend in the YZ plane in FIG. 7, i.e., perpendicular to the X-axis direction.

The plurality of first barrier plates 531 and second barrier plates 541 arranged as described above partition a deposition space between the deposition source nozzle unit 520 and the patterning slit sheet 550. In the thin film deposition apparatus 500, the deposition space is divided by the first barrier plates 531 and the second barrier plates 541 into sub-deposition spaces that respectively correspond to the deposition source nozzles 521 through which the deposition material 515 is discharged.

The second barrier plates 541 may be disposed to correspond respectively to the first barrier plates 531. In other words, the second barrier plates 541 may be aligned with the first barrier plates 531, respectively. Each pair of the corresponding first and second barrier plates 531 and 541 may be located on the same plane. As described above, since the deposition space between the deposition source nozzle unit 520 and the patterning slit sheet 550, which will be described later, is partitioned by the first barrier plates 531 and the second barrier plates 541, which are disposed parallel to each other, the deposition material 515 discharged through one of the deposition source nozzles 521 is not mixed with the deposition material 515 discharged through the other deposition source nozzles 521, and is deposited on the substrate 600 through the patterning slits 551. In other words, the first barrier plates 531 and the second barrier plates 541 guide the deposition material 515, which is discharged through the deposition source nozzles 521, not to flow in the X-axis direction.

Although the first barrier plates 531 and the second barrier plates 541 are respectively illustrated as having the same thickness in the X-axis direction, the aspects of the present invention are not limited thereto. In other words, the second barrier plates 541, which need to be accurately aligned with the patterning slit sheet 550, may be formed to be relatively thin, whereas the first barrier plates 531, which do not need to be precisely aligned with the patterning slit sheet 550, may be formed to be relatively thick. This makes it easier to manufacture the thin film deposition apparatus 500.

Figure 8:
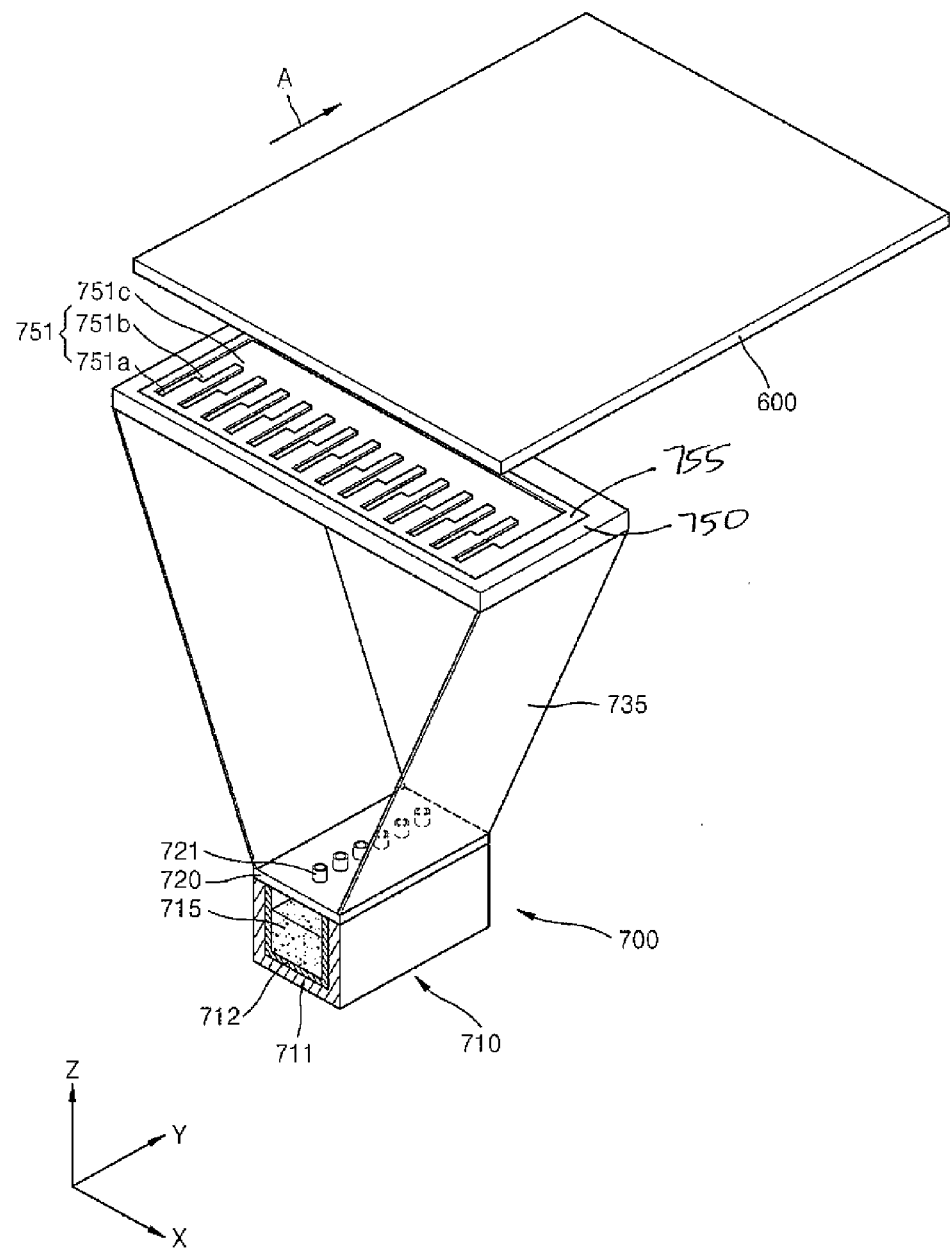
FIG. 8 is a schematic perspective view of a thin film deposition apparatus according to another embodiment of the present invention.
Figure 9:
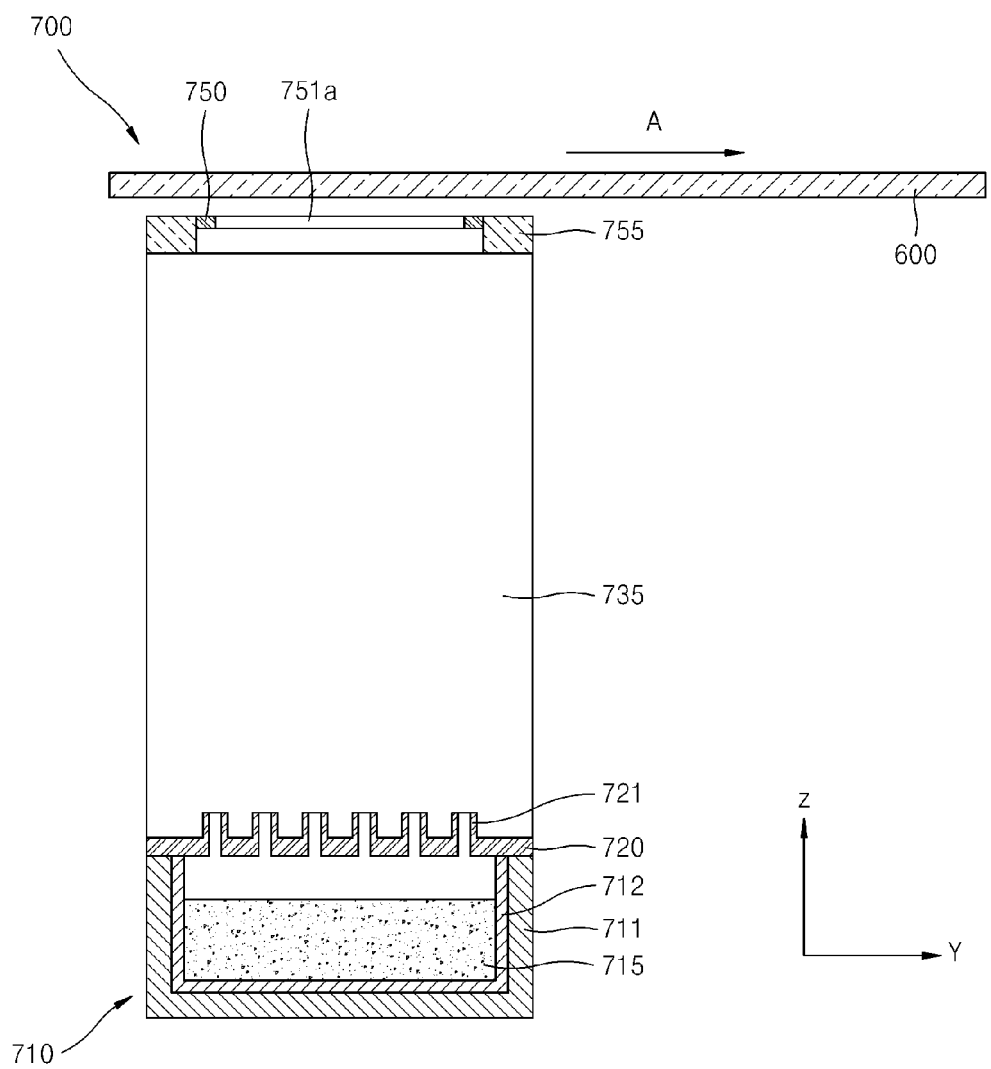
FIG. 9 is a schematic side view of the thin film deposition apparatus illustrated in FIG. 8, according to an embodiment of the present invention.
Figure 10:
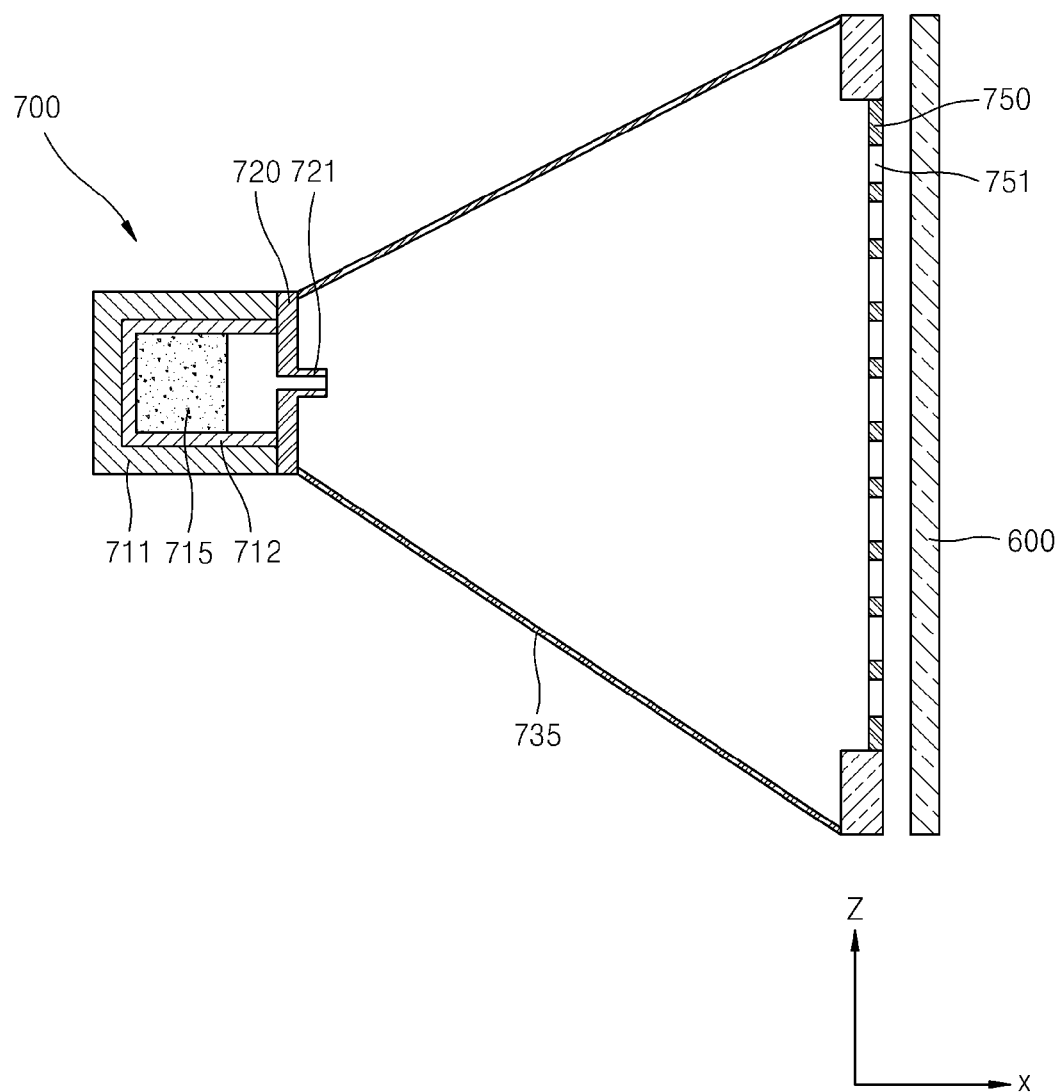
FIG. 10 is a schematic plan view of the thin film deposition apparatus of FIG. 8, according to an embodiment of the present invention.

FIG. 8 is a schematic perspective view of a thin film deposition apparatus 700 according to another embodiment of the present invention. FIG. 9 is a schematic side view of the thin film deposition apparatus 700 illustrated in FIG. 8. FIG. 10 is a schematic plan view of the thin film deposition apparatus 700 illustrated in FIG. 8.

Referring to FIGS. 8, 9 and 10, the thin film deposition apparatus 700 includes a deposition source 710, a deposition source nozzle unit 720, a patterning slit sheet 750 and a frame 755.

Although a chamber is not illustrated in FIGS. 8, 9 and 10 for convenience of explanation, all the components of the thin film deposition apparatus 700 may be disposed within a chamber that is maintained at an appropriate degree of vacuum. The chamber is maintained at an appropriate vacuum in order to allow a deposition material to move in a substantially straight line through the thin film deposition apparatus 700.

A substrate 600 that is a deposition target is disposed in the chamber. The deposition source 710 that contains and heats a deposition material 715 is disposed in an opposite side of the chamber to that in which the substrate 600 is disposed. The deposition source 710 may include a crucible 711 and a heater 712.

The deposition source nozzle unit 720 is disposed at a side of the deposition source 710, and in particular, at the side of the deposition source 710 facing the substrate 600. The deposition source nozzle unit 720 includes a plurality of deposition source nozzles 721 arranged in the Y-axis direction, i.e., a scanning direction of the substrate 600. The plurality of deposition source nozzles 721 may be disposed at equal intervals. The deposition material 715 that is vaporized in the deposition source 710 passes through the deposition source nozzle unit 720 towards the substrate 600. As described above, if the plurality of deposition source nozzles 721 are formed on the deposition source nozzle unit 720 in the Y-axis direction, that is, the scanning direction of the substrate 600, then a size of a pattern formed by the deposition material 715 that is discharged through each of patterning slits 751 in the patterning slit sheet 750 is only affected by the size of one deposition source nozzle 721, that is, it may be considered that one deposition nozzle 721 exists in the X-axis direction. Thus, there is no shadow zone on the substrate 600. Since the plurality of deposition source nozzles 721 are formed in the scanning direction of the substrate 600, even there is a difference between fluxes of the deposition source nozzles 721, the difference may be compensated for and deposition uniformity may be maintained constantly.

The patterning slit sheet 750 and a frame 755 are disposed between the deposition source 710 and the substrate 600. The frame 755 may be formed in a lattice shape, similar to a window frame. The patterning slit sheet 750 is bound inside the frame 755. The patterning slit sheet 750 includes a plurality of patterning slits 751 arranged in the X-axis direction. The deposition material 715 that is vaporized in the deposition source 710 passes through the deposition source nozzle unit 720 and the patterning slit sheet 750 towards the substrate 600. The patterning slit sheet 750 may be manufactured by etching, which is the same method as used in a conventional method of manufacturing an FMM, and in particular, a striped FMM.

In the thin film deposition apparatus 700, each of the patterning slits 751 includes sub slits that are different in length. Thus, a capping layer corresponding to a red sub pixel, a capping layer corresponding to a green sub pixel, and a capping layer corresponding to a blue sub pixel (see the capping layers 64R, 64G, and 64B illustrated in FIG. 2), may be sequentially formed. That is, each of the patterning slits 751 includes a first patterning sub slit 751*a*, a second patterning sub slit 751*b*, and a third patterning sub slit 751*c*. The first patterning slit 751*a* corresponds to a red sub pixel region, the second patterning slit 751*b* corresponds to a green sub pixel region, and the third patterning slit 751*c* corresponds to a blue sub pixel region.

The first patterning slit 751*a* for forming the capping layer corresponding to the red sub pixel, the thickness of which is relative thick (see the capping layer 64R of FIG. 2) may be longest, the second patterning slit 751*b* for forming the capping layer corresponding to the green sub pixel, the thickness of which is thinner than the capping layer corresponding to the red sub pixel (see the capping layer 64G of FIG. 2) may be shorter than the first patterning slit 751*a*, and the capping layer corresponding to the blue sub pixel, the thickness of which is thinner than the capping layer corresponding to the green sub pixel (see the capping layer 64B of FIG. 2) may be shorter than the second patterning slit 751*b*. The patterning slits 751 are as described above with reference to FIG. 3.

The deposition source 710 (and the deposition source nozzle unit 720 coupled to the deposition source 710) and the patterning slit sheet 750 may be formed to be separated from each other by a predetermined distance. Alternatively, the deposition source 710 (and the deposition source nozzle unit 720 coupled to the deposition source 710) and the patterning slit sheet 750 may be connected by a connection unit 735. That is, the deposition source 710, the deposition source nozzle unit 720, and the patterning slit sheet 750 may be formed integrally with one another by being connected to each other via the connection unit 735. The connection unit 735 guides the deposition material 715, which is discharged through the deposition source nozzles 721, to move straight, not to flow in the X-axis direction. In FIGS. 8 through 10, the connection units 735 are formed on left and right sides of the deposition source 710, the deposition source nozzle unit 720, and the patterning slit sheet 750 to guide the deposition material 715 not to flow in the X-axis direction, however, the aspects of the present invention are not limited thereto. That is, the connection units 735 may be formed to seal the deposition source 710, the deposition source nozzle unit 720, and the patterning slit sheet 750 in the form of a box in order to guide the deposition material 715 in both the X-axis and Y-axis directions.

As described above, the thin film deposition apparatus 700 performs deposition while being moved relative to the substrate 600. In order to move the thin film deposition apparatus 700 relative to the substrate 600, the patterning slit sheet 750 is separated from the substrate 600 by a predetermined distance.

As described above, according to an aspect of the present invention, a mask is formed to be smaller than a substrate and deposition is performed while the mask is moved relative to the substrate. Thus, the mask can be easily manufactured. In addition, defects caused due to the contact between a substrate and an FMM, which occurs in the conventional deposition method, may be prevented. In addition, since it is unnecessary to use the FMM in close contact with the substrate during a deposition process, the manufacturing speed may be improved.

As described above, a thin film deposition apparatus, a method of manufacturing an organic light-emitting display device by using the thin film deposition apparatus, and an organic light-emitting display device manufactured using the method according to an aspect of the present invention may be simply applied to manufacture large-sized display devices on a mass scale. In addition, the thin film deposition apparatus and the organic-light-emitting display device may be easily manufactured and may improve manufacturing yield and deposition efficiency.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A thin film deposition apparatus for forming a thin film on a substrate, the apparatus comprising:
a deposition source that discharges a deposition material;
a deposition source nozzle unit disposed at a side of the deposition source and including a plurality of deposition source nozzles arranged in a first direction;
a patterning slit sheet disposed opposite to the deposition source nozzle unit and including a common deposition region at an end of the patterning slit sheet and a plurality of patterning slits on the other end in a second direction perpendicular to the first direction, where each of the plurality of patterning slits includes a plurality of patterning sub slits that are different in length; and
a barrier plate assembly disposed between the deposition source nozzle unit and the patterning slit sheet in the first direction, and including a plurality of barrier plates that partition a deposition space between the deposition source nozzle unit and the patterning slit sheet into a plurality of sub-deposition spaces,
wherein the thin film deposition apparatus is separated from the substrate by a predetermined distance, and
the thin film deposition apparatus and the substrate are movable relative to each other.

2. The thin film deposition apparatus of claim 1, wherein each of the plurality of patterning slits comprises a first patterning sub slit having a first length, a second patterning sub slit having a second length that is different from the first length, and a third patterning sub slit having a third length that is different from the first and second lengths.

3. The thin film deposition apparatus of claim 2, wherein the first to third patterning sub slits are alternately and repeatedly formed in the patterning slit sheet.

4. The thin film deposition apparatus of claim 2, wherein the first to third patterning slits correspond to a red sub pixel region, a green sub pixel region, and a blue sub pixel region of the substrate, respectively, and the first length is longer than the second length and the second length is longer than the third length.

5. The thin film deposition apparatus of claim 2, wherein amounts of the deposition material deposited on regions of the substrate are controlled according to the lengths of the first to third patterning sub slits.

6. The thin film deposition apparatus of claim 2, wherein the deposition material discharged from the deposition source is subsequently deposited on the red, green, and blue sub pixel regions on the substrate.

7. The thin film deposition apparatus of claim 6, wherein a layer of the deposition material deposited on the red sub pixel region is thicker than a layer of the deposition material deposited on the green pixel region, and
a layer of the deposition material deposited on the green sub pixel region is thicker than a layer of the deposition material deposited on the blue sub pixel region.

8. The thin film deposition apparatus of claim 1, wherein each of the barrier walls extends in a second direction that is substantially perpendicular to the first direction, in order to partition the deposition space between the deposition source nozzle unit and the patterning slit sheet into the plurality of sub-deposition spaces.

9. The thin film deposition apparatus of claim 1, wherein the plurality of barrier plates are arranged at equal intervals.

10. The thin film deposition apparatus of claim 1, wherein the barrier plate assembly comprises a first barrier plate assembly including a plurality of first barrier plates and a second barrier plate assembly including a plurality of second barrier plates.

11. The thin film deposition apparatus of claim 10, wherein each of the first barrier plates and the second barrier plates extend in a second direction that is substantially perpendicular to the first direction, in order to partition the deposition space between the deposition source nozzle unit and the patterning slit sheet into the plurality of sub-deposition spaces.

12. The thin film deposition apparatus of claim 10, wherein the first barrier plates are arranged to respectively correspond to the second barrier plates.

13. The thin film deposition apparatus of claim 12, wherein each pair of the corresponding first and second barrier plates is arranged on substantially a same plane.

14. The thin film deposition apparatus of claim 1, wherein the deposition material discharged from the thin film deposition apparatus is continuously deposited on the substrate while the substrate is moved relative to the thin film deposition apparatus.

15. The thin film deposition apparatus of claim 1, wherein the thin film deposition apparatus or the substrate is moved relative to each other along a plane parallel to a surface of the substrate on which the deposition material is deposited.

16. The thin film deposition apparatus of claim 1, wherein the barrier plate assembly guides the deposition material discharged from the deposition source.

17. The thin film deposition apparatus of claim 1, wherein the patterning slit sheet of the thin film deposition apparatus is smaller than the substrate.

18. A thin film deposition apparatus for forming a thin film on a substrate, the apparatus comprising:
   a deposition source that discharges a deposition material;
   a deposition source nozzle unit disposed at a side of the deposition source and including a plurality of deposition source nozzles arranged in a first direction; and
   a patterning slit sheet disposed opposite to the deposition source nozzle unit and including a common deposition region at an end of the patterning slit sheet and a plurality of patterning slits on the other end and arranged in a second direction perpendicular to the first direction, where each of the plurality of pattering slits includes a plurality of patterning sub slits that are different in length,
   wherein deposition is performed while the substrate is moved relative to the thin film deposition apparatus in the first direction, and
   the deposition source, the deposition source nozzle unit, and the patterning slit sheet are formed integrally with one another.

19. The thin film deposition apparatus of claim 18, wherein each of the plurality of patterning slits comprises a first patterning sub slit having a first length, a second patterning sub slit having a second length that is different from the first length, and a third patterning sub slit having a third length that is different from the first and second lengths.

20. The thin film deposition apparatus of claim 19, wherein the first to third patterning sub slits are alternately and repeatedly formed in the patterning slit sheet.

21. The thin film deposition apparatus of claim 19, wherein the first to third patterning slits correspond to a red sub pixel region, a green sub pixel region, and a blue sub pixel region of the substrate, respectively, and the first length is longer than the second length and the second length is longer than the third length.

22. The thin film deposition apparatus of claim 19, wherein amounts of the deposition material deposited on regions of the substrate are controlled according to the lengths of the first to third patterning sub slits.

23. The thin film deposition apparatus of claim 19, wherein the deposition material discharged from the deposition source is subsequently deposited on the red, green, and blue sub pixel regions on the substrate.

24. The thin film deposition apparatus of claim 23, wherein a layer of the deposition material deposited on the red sub pixel region is thicker than a layer of the deposition material deposited on the green pixel region, and
   a layer of the deposition material deposited on the green sub pixel region is thicker than the deposition material deposited on the blue sub pixel region.

25. The thin film deposition apparatus of claim 18, wherein the patterning slit sheet of the thin film deposition apparatus is smaller than the substrate.

26. The thin film deposition apparatus of claim 18, wherein the deposition source, the deposition source nozzle unit, and the patterning slit sheet are formed integrally with one another by a connection unit.

27. The thin film deposition apparatus of claim 26, wherein the connection unit guides movement of the discharged deposition material.

28. The thin film deposition apparatus of claim 26, wherein the connection unit seals a space between the deposition source, the deposition source nozzle unit, and the patterning slit sheet.

29. The thin film deposition apparatus of claim 18, wherein the thin film deposition apparatus is separated from the substrate by a predetermined distance.

30. The thin film deposition apparatus of claim 18, wherein the deposition material discharged from the thin film deposition apparatus is continuously deposited on the substrate while the substrate is moved relative to the thin film deposition apparatus in the first direction.

31. A method of manufacturing an organic light-emitting display device, the method comprising:
   performing deposition on a substrate while a thin film deposition apparatus and the substrate are moved relative to each other, wherein the substrate is fixedly supported by a chuck and the thin film deposition apparatus is disposed apart from the substrate,
   wherein the thin film deposition apparatus comprises:
   a deposition source that discharges a deposition material; a deposition source nozzle unit disposed at a side of the deposition source and including a plurality of deposition source nozzles arranged in a first direction;
   a patterning slit sheet disposed opposite to the deposition source nozzle unit and including a common deposition region at an end of the patterning slit sheet and a plurality of patterning slits on the other end in a second direction perpendicular to the first direction, where each of the plurality of pattering slits includes a plurality of patterning sub slits that are different in length; and
   a barrier plate assembly disposed between the deposition source nozzle unit and the patterning slit sheet in the first direction, and including a plurality of barrier plates that partition a deposition space between the deposition source nozzle unit and the patterning slit sheet into a plurality of sub-deposition spaces.

32. The method of 31, wherein the deposition material comprises an organic material,
   and the thin film deposition apparatus further comprises a plurality of capping layers corresponding to a sub pixel emitting red light, a sub pixel emitting green light, and a sub pixel emitting blue light, respectively, where the plurality of capping layers have different thicknesses from one another.

33. A method of manufacturing an organic light-emitting display device, the method comprising:
   performing deposition on a substrate while a thin film deposition apparatus and the substrate are moved relative to each other, wherein the substrate is fixedly supported by a chuck and the thin film deposition apparatus is disposed apart from the substrate,
   wherein the thin film deposition apparatus comprises:
   a deposition source that discharges a deposition material;
   a deposition source nozzle unit disposed at a side of the deposition source and including a plurality of deposition source nozzles arranged in a first direction; and
   a patterning slit sheet disposed opposite to the deposition source nozzle unit and including a common deposition region at an end of the patterning slit sheet and a plurality of patterning slits on the other end and arranged in a second direction perpendicular to the first direction, where each of the plurality of pattering slits includes a plurality of patterning sub slits that are different in length.

34. The method of 33, wherein the deposition material comprises an organic material, and
the thin film deposition apparatus further comprises a plurality of capping layers corresponding to a sub pixel emitting red light, a sub pixel emitting green light, and a sub pixel emitting blue light, respectively, where the plurality of capping layers have different thicknesses from one another.

\* \* \* \* \*